US012696448B2

(12) United States Patent
Komiya

(10) Patent No.: US 12,696,448 B2
(45) Date of Patent: Jul. 28, 2026

(54) SEMICONDUCTOR DEVICE

(71) Applicant: Kioxia Corporation, Tokyo (JP)

(72) Inventor: Ken Komiya, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 993 days.

(21) Appl. No.: 17/840,418

(22) Filed: Jun. 14, 2022

(65) Prior Publication Data

US 2023/0225122 A1     Jul. 13, 2023

(30) Foreign Application Priority Data

Jan. 11, 2022    (JP) ................................. 2022-002502

(51) Int. Cl.
| | |
|---|---|
| *H10B 41/20* | (2023.01) |
| *H10B 43/10* | (2023.01) |
| *H10B 43/27* | (2023.01) |

(52) U.S. Cl.
CPC ............. *H10B 43/10* (2023.02); *H10B 43/27* (2023.02)

(58) Field of Classification Search
CPC ......... H10B 43/10; H10B 43/27; H10B 43/50
See application file for complete search history.

(56) References Cited

U.S. PATENT DOCUMENTS

| | | | |
|---|---|---|---|
| 10,840,258 B2 | 11/2020 | Mizutani et al. | |
| 2019/0287989 A1* | 9/2019 | Mizutani ................ | H10D 30/63 |
| 2021/0296328 A1 | 9/2021 | Komiya | |

FOREIGN PATENT DOCUMENTS

JP          2019161010 A      9/2019

* cited by examiner

*Primary Examiner* — Samuel Park
(74) *Attorney, Agent, or Firm* — Holtz, Holtz & Volek PC

(57)     ABSTRACT

A semiconductor device includes a stack including first electrode films stacked in a first direction. First and second isolating portions isolate the first electrode films. Third and fourth isolating portions isolate only one or more of the first electrode films in an upper portion of the first electrode films in the stack in a third direction, and are arranged in the third direction between the first and second isolating portions. The column portions include first and second column portions between the first and third isolating portions. The column portions include third and fourth column portions between the third and fourth isolating portions. The second column portion is adjacent to the first column portion. The fourth column portion is adjacent to the third column portion. A first interval between the first and second column portions is different from a second interval between the third and fourth column portions.

11 Claims, 21 Drawing Sheets

2m

SEMICONDUCTOR DEVICE

CROSS REFERENCE TO RELATED APPLICATIONS

This application is based upon and claims the benefit of priority from the prior Japanese Patent Application No. 2022-002502, filed on Jan. 11, 2022, the entire contents of which are incorporated herein by reference.

FIELD

The embodiments of the present invention relate to a semiconductor device.

BACKGROUND

A semiconductor storage device such as a NAND flash memory may include a three-dimensional memory cell array including a plurality of memory cells arranged three-dimensionally. In such a three-dimensional memory cell array, an interval between adjacent memory holes is becoming narrower in order to increase the density of memory holes as much as possible.

However, in a case where the interval between adjacent memory holes becomes narrow, when sacrifice films of a stack of insulation films and the sacrifice films are replaced with metal films (in a replacement process) in formation of a memory cell array, the embeddability of a material for the metal films is deteriorated, and the material for the metal films may not spread around the memory hole. In this case, a void remains between the memory hole and the metal films, causing increase of defective memory cells.

DETAILED DESCRIPTION

Figure 1:
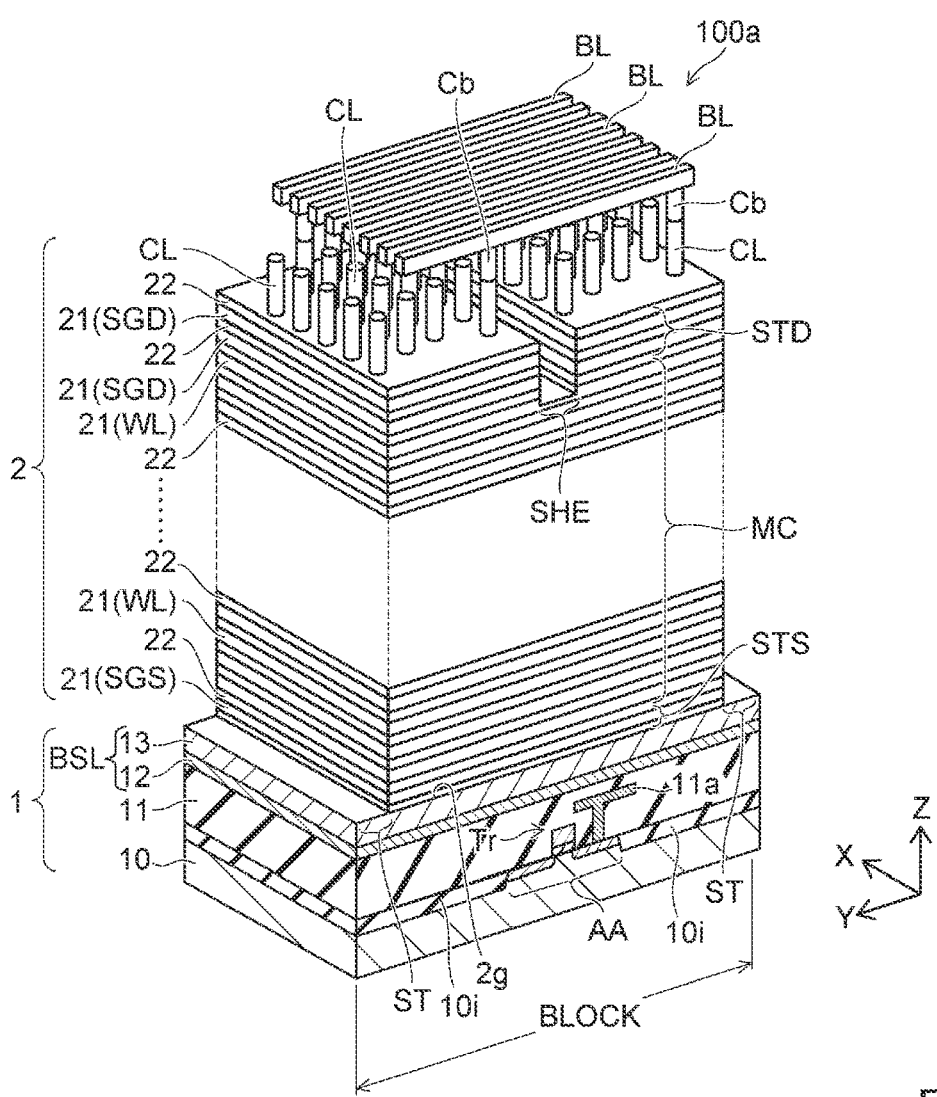
FIG. 1 is a schematic perspective view of an example of a semiconductor device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a stack including a plurality of first electrode films stacked in a first direction and isolated from each other. A plurality of column portions extend in the stack in the first direction and each includes a semiconductor portion. A first isolating portion extends in the stack in the first direction and a second direction crossing the first direction and is configured to isolate the first electrode films in a third direction crossing the first and second directions. A second isolating portion is adjacent to the first isolating portion in the third direction, extends in the stack in the first and second directions, and is configured to isolate the first electrode films in the third direction. At least third and fourth isolating portions extend in the stack in the first and second directions, are configured to isolate only one or more of the first electrode films in an upper portion of the first electrode films in the third direction, and are arranged in the third direction between the first isolation portion and the second isolating portion from the first isolating portion toward the second isolating portion. The column portions include a first column portion and a second column portion provided between the first isolating portion and the third isolating portion adjacent to the first isolating portion in the third direction. The column portions include a third column portion and a fourth column portion provided between the third isolating portion and the fourth isolating portion adjacent to the third isolating portion. The second column portion is adjacent to the first column portion as viewed in the first direction. The fourth column portion is adjacent to the third column portion as viewed in the first direction. A first interval between the first column portion and the second column portion is different from a second interval between the third column portion and the fourth column portion.

First Embodiment

Figure 2:
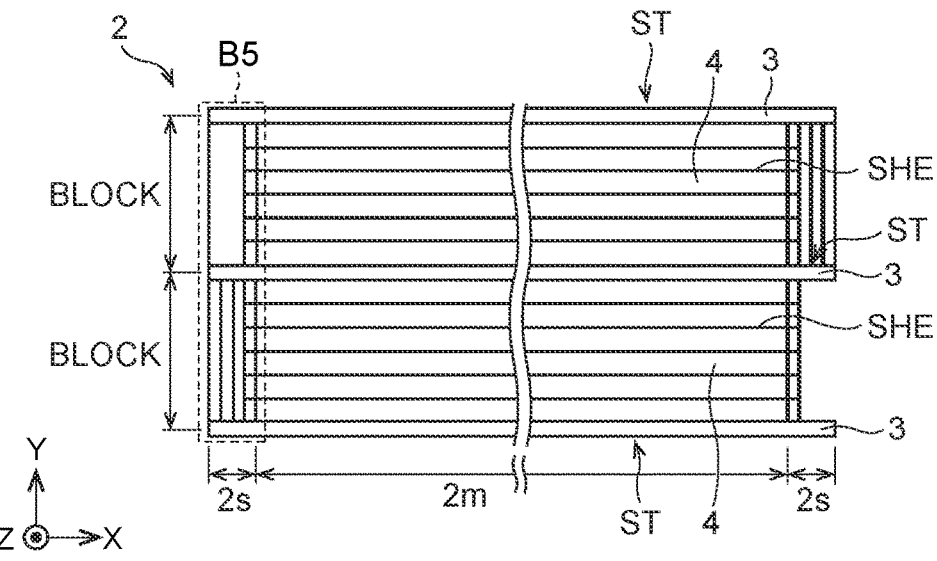
FIG. 2 is a schematic plan view of a stack in FIG. 1.
Figures 3, 4:
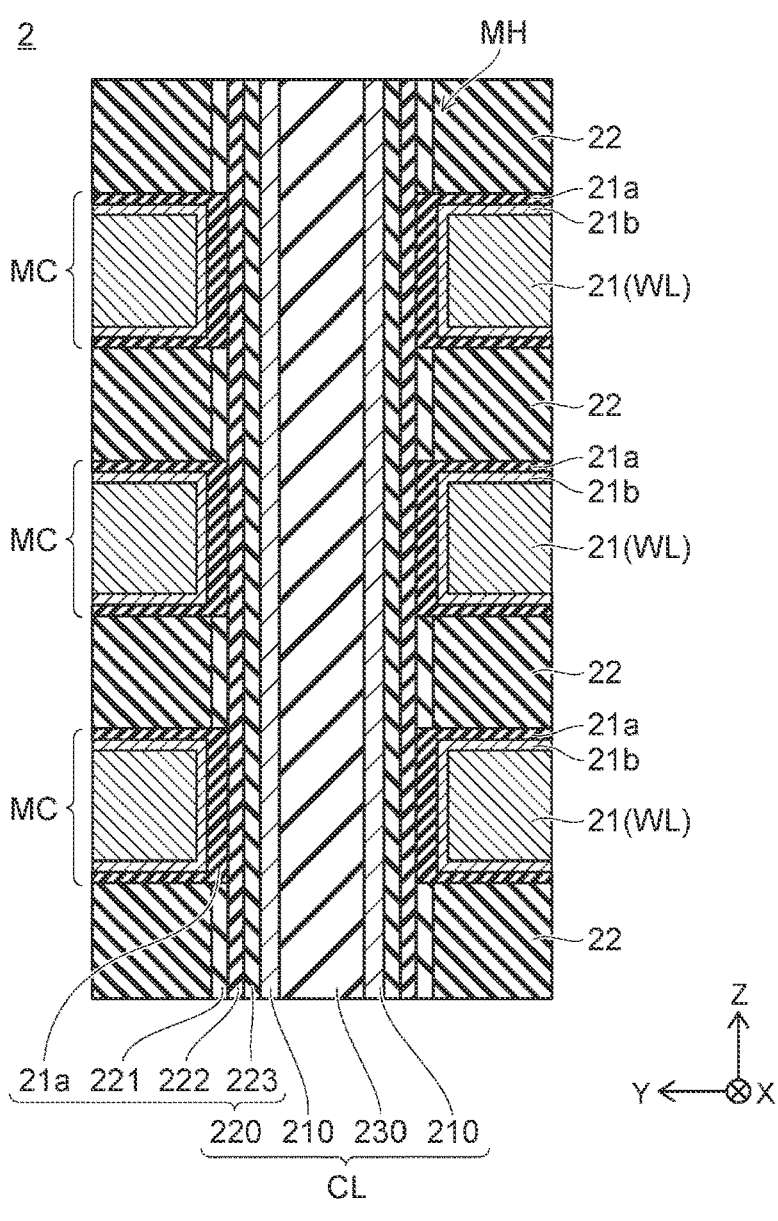
FIGS. 3 and 4 are schematic cross-sectional views of an example of a memory cell having a three-dimensional configuration.

FIG. 1 is a schematic perspective view of an example of a semiconductor device (for example, a semiconductor storage device 100a) according to a first embodiment. FIG. 2 is a schematic plan view of a stack 2 in FIG. 1. In the present specification, a stacking direction of the stack 2 refers to the Z-direction. One direction that crosses the Z-direction, for example, at a right angle refers to the Y-direction. One direction that crosses the Z-direction and the Y-direction, for example, at a right angle refers to the X-direction. FIGS. 3 and 4 are schematic cross-sectional views of an example of a memory cell having a three-dimensional configuration.

As illustrated in FIGS. 1 to 4, the semiconductor storage device 100a according to the first embodiment is a non-volatile memory including memory cells having a three-dimensional configuration.

The semiconductor storage device 100a includes a base portion 1, the stack 2, a deep slit ST (a plate-shaped portion 3), a shallow slit SHE (a plate-shaped portion 4), and a plurality of column portions CL.

The base portion 1 includes a substrate 10, an interlayer dielectric film 11, a conductive layer 12, and a semiconductor portion 13. The interlayer dielectric film 11 is provided on the substrate 10. The conductive layer 12 is provided on the interlayer dielectric film 11. The semiconductor portion 13 is provided on the conductive layer 12.

The substrate 10 is a semiconductor substrate, for example, a silicon substrate. The conductivity type of silicon (Si) is, for example, a p-type. An element isolation region 10i, for example, is provided in a surface region of the substrate 10. The element isolation region 10i is an insulating region that contains, for example, silicon oxide ($SiO_2$) and defines an active area AA in the surface region of the substrate 10. Source and drain regions of a transistor Tr are provided in the active area AA. The transistor Tr configures a peripheral circuit (a CMOS (Complementary Metal Oxide Semiconductor) circuit) of the non-volatile memory. The CMOS circuit is provided below a built-in source layer BSL and on the substrate 10. The interlayer dielectric film 11 contains, for example, silicon oxide and insulates the transistor Tr. A wire 11a is provided in the interlayer dielectric film 11. A portion of the wire 11a is electrically connected to the transistor Tr. The conductive layer 12 contains a conductive metal, for example, tungsten (W). The semiconductor portion 13 contains, for example, silicon. The conductivity type of silicon is an n-type, for example. The semiconductor portion 13 may be formed by a plurality of layers, and a portion thereof may contain undoped silicon. Further, either the conductive layer 12 or the semiconductor portion 13 may be omitted.

The conductive layer 12 and the semiconductor portion 13 serve as a common source line of a memory cell array (2m in FIG. 2). The conductive layer 12 and the semiconductor portion 13 are electrically connected to each other as an integrated conductive film and are also referred to as "built-in source layer BSL" collectively.

The stack 2 is provided above the substrate 10 and is located in the Z-direction with respect to the conductive layer 12 and the semiconductor portion 13 (the built-in source layer BSL). The stack 2 is configured by a plurality of electrode films 21 and a plurality of insulation films 22 alternately stacked along the Z-direction. The electrode films 21 contain a conductive metal, for example, tungsten. The insulation films 22 contain, for example, silicon oxide. The insulation films 22 insulate the electrode films 21 from each other. Therefore, the electrode films 21 are stacked in the Z-direction (a first direction) and separated from each other to be electrically isolated from each other. The stacked number of each of the electrode films 21 and the insulation films 22 may be any number. The insulation films 22 may be air gaps, for example. An insulation film 2g, for example, is provided between the stack 2 and the semiconductor portion 13. The insulation film 2g contains, for example, silicon oxide. The insulation film 2g may contain a high dielectric material having a higher relative permittivity than silicon oxide. The high dielectric material may be metal oxide, for example.

The electrode films 21 include at least one source-side selection gate SGS, a plurality of word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The source-side selection gate SGS is provided in a lower region of the stack 2. The drain-side selection gate SGD is provided in an upper region of the stack 2. The lower region refers to a region of the stack 2 closer to the base portion 1, and the upper region refers to a region of the stack 2 farther from base portion 1. The word lines WL are provided between the source-side selection gate SGS and the drain-side selection gate SGD.

The thickness in the Z-direction of one of the insulation films 22 which insulates the source-side selection gate SGS and the word line WL from each other may be larger than the thickness in the Z-direction of the insulation film 22 that insulates the word lines WL from each other, for example. Further, a cover insulation film (not illustrated) may be provided on the uppermost insulation film 22 that is the farthest from the base portion 1. The cover insulation film contains silicon oxide, for example.

The semiconductor storage device 100a includes the plural memory cells MC connected in series between the source-side selection transistor STS and the drain-side selection transistor STD. The configuration in which the source-side selection transistor STS, the memory cells MC, and the drain-side selection transistor STD are connected in series is called "memory string" or "NAND string". The memory string is connected to a bit line BL, for example, via a contact Cb. The bit line BL is provided above the stack 2 and extends in the Y-direction.

The deep slits ST and the shallow slits SHE are provided in the stack 2. The deep slits ST extend in the X-direction in plan view as viewed in the Z-direction. The deep slits ST are provided in the stack 2 to penetrate through the stack 2 in the Z-direction from the top end of the stack 2 to the base portion 1. The plate-shaped portion 3 is a wire provided in each deep slit ST (FIG. 2). The plate-shaped portion 3 is electrically insulated from the stack 2 by an insulation film (not illustrated) provided on the inner wall of the deep slit ST and is formed by a conductive film embedded in the deep slit ST and electrically connected to the built-in source layer BSL. The plate-shaped portion 3 is filled with an insulation material, such as silicon oxide, in some cases. The deep slit ST extends in the Z-direction in the stack 2 and electrically isolates the electrode films 21 in the Y-direction.

The shallow slits SHE extend in the X-direction in plan view as viewed in the Z-direction. The shallow slits SHE extend in the Z-direction in the stack 2 from the top end of the stack 2 to the middle of the stack 2 in a vertical section. The shallow slits SHE penetrate through one or a plurality of the electrode films 21 arranged in the upper region of the stack 2 in which the drain-side selection gate SGD is provided, thereby electrically isolating only the electrode films 21 in the upper region from each other in the Y-direction. The plate-shaped portion 4, for example, is provided in each shallow slit SHE (FIG. 2). The plate-shaped portion 4 is silicon oxide, for example.

As illustrated in FIG. 2, the stack 2 includes a stair portion 2s and the memory cell array 2m. The stair portion 2s is provided at an edge of the stack 2. The memory cell array 2m is sandwiched between the stair portions 2s or surrounded by the stair portions 2s. The deep slit ST is provided from the stair portion 2s at one end of the stack 2 to the stair portion 2s at the other end of the stack 2 through the memory cell array 2m. The shallow slit SHE is provided at least in the memory cell array 2m. In plan view as viewed in the Z-direction, the shallow slits SHE are provided between the deep slits ST adjacent to each other, and extend in the X-direction substantially in parallel to the deep slits ST.

A portion of the stack 2 sandwiched between two slits ST illustrated in FIG. 2 is called "block (BLOCK)". The block is the minimum unit for erasing data, for example. The shallow slits SHE are provided in the block between the slits ST. The stack 2 between the shallow slits SHE or between the deep slit ST and the shallow slit SHE is called "finger". The drain-side selection gate SGD is divided for each finger. Therefore, in data writing and data reading, one finger in a block can be selected by the drain-side selection gate SGD.

As illustrated in FIG. 3, each of the column portions CL is provided in a memory hole MH formed in the stack 2. Each column portion CL penetrates through the stack 2 from the top end of the stack 2 along the Z-direction and is provided in the stack 2 and in the built-in source layer BSL. Each of the column portions CL includes a semiconductor body 210, a memory film 220, and a core layer 230. The column portion CL includes the core layer 230 provided at its center, the semiconductor body 210 provided around the core layer 230, and the memory film 220 provided around the semiconductor body 210. The semiconductor body 210 is a semiconductor portion provided in the stack 2 to extend in the Z-direction and contains, for example, monocrystalline silicon, polysilicon, or amorphous silicon. The semiconductor body 210 is electrically connected to the built-in source layer BSL. The memory film 220 as a charge storage member has a charge trapping portion between the semiconductor body 210 and the electrode film 21. The column portions CL selected one by one from the respective fingers are connected to one bit line BL in common via the contacts Cb. Each column portion CL is provided in a cell region (Cell), for example.

The shape of the memory hole MH in an X-Y plane is, for example, circular or elliptical, as illustrated in FIG. 4. A block insulation film 21a that configures a portion of the memory film 220 may be provided between the electrode film 21 and the insulation film 22. The block insulation film 21a is, for example, a silicon oxide film or a metal oxide film. One example of the metal oxide is aluminum oxide. A barrier film 21b may be provided between the electrode film 21 and the insulation film 22 and between the electrode film 21 and the memory film 220. For example, titanium nitride is selected as the barrier film 21b in a case where the electrode film 21 is made of, for example, tungsten. The block insulation film 21a prevents back tunneling of electric charges from the electrode film 21 toward the memory film 220. The barrier film 21b improves adhesion between the electrode film 21 and the block insulation film 21a.

The semiconductor body 210 has a shape of a tube with a bottom, for example. The semiconductor body 210 contains, for example, silicon. This silicon is polysilicon obtained by crystallizing amorphous silicon, for example. The semiconductor body 210 is made of, for example, undoped silicon. The semiconductor body 210 may be made of p-type silicon. The semiconductor body 210 serves as a channel of each of the drain-side selection transistor STD, the memory cell MC, and the source-side selection transistor STS.

A portion of the memory film 220, other than the block insulation film 21a, is provided between the inner wall of the memory hole MH and the semiconductor body 210. The shape of the memory film 220 is tubular, for example. The memory cells MC each include a storage region between the semiconductor body 210 and the electrode film 21 that serves as the word line WL, and are stacked in the Z-direction. The memory film 220 includes a cover insulation film 221, a charge trapping film 222, and a tunnel insulation film 223, for example. The semiconductor body 210, the charge trapping film 222, and the tunnel insulation film 223 extend in the Z-direction.

The cover insulation film 221 is provided between the insulation film 22 and the charge trapping film 222. The cover insulation film 221 contains silicon oxide, for example. The cover insulation film 221 protects the charge trapping film 222 from being etched in replacement of sacrifice films (not illustrated) with the electrode films 21 (in a replacement process). The cover insulation film 221 may be removed from between the electrode film 21 and the memory film 220 in the replacement process. In this case, the block insulation film 21a, for example, is provided between the electrode film 21 and the charge trapping film 222, as illustrated in FIGS. 3 and 4. The cover insulation film 221 may not be included in a case where the replacement process is not used for forming the electrode film 21.

The charge trapping film 222 is provided between the block insulation film 21a and the cover insulation film 221, and the tunnel insulation film 223. The charge trapping film 222 contains silicon nitride, for example, and has trap sites that trap electric charges therein. A portion of the charge trapping film 222, sandwiched between the electrode film 21 serving as the word line WL and the semiconductor body 210, configures a storage region of the memory cell MC as a charge trapping portion. A threshold voltage of the memory cell MC is changed depending on whether any electric charge is present in the charge trapping portion or in accordance with the amount of the electric charges trapped in the charge trapping portion. In this manner, the memory cell MC retains information.

The tunnel insulation film 223 is provided between the semiconductor body 210 and the charge trapping film 222. The tunnel insulation film 223 contains silicon oxide, or silicon oxide and silicon nitride, for example. The tunnel insulation film 223 is a potential barrier between the semiconductor body 210 and the charge trapping film 222. For example, when electrons are injected from the semiconductor body 210 to the charge trapping portion (in a write operation) and when holes are injected from the semiconductor body 210 to the charge trapping portion (in an erase operation), the electrons and the holes each pass (tunnel) through the potential barrier formed by the tunnel insulation film 223.

The core layer 230 is embedded in a space within the tubular semiconductor body 210. The shape of the core layer 230 is columnar, for example. The core layer 230 contains silicon oxide, for example, and is insulative.

Figure 5:
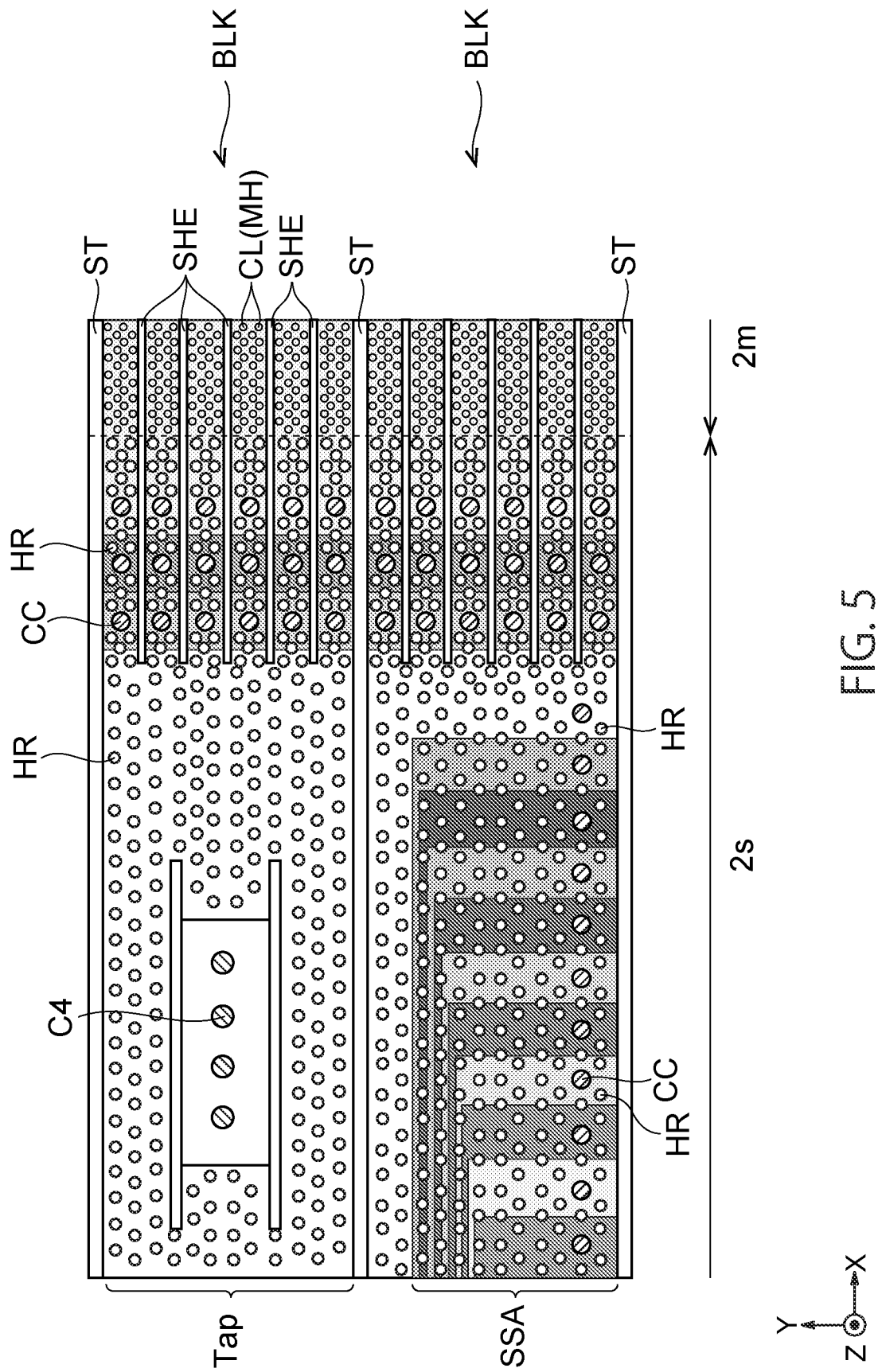
FIG. 5 is a plan view illustrating a configuration example of a boundary between the memory cell array and the stair portion.

FIG. 5 is a plan view illustrating a configuration example of a boundary between the memory cell array 2m and the stair portion 2s. The column portions CL are provided in the memory holes MH in the memory cell array 2$m$. FIG. 5 illustrates a planar layout in a broken-line frame B5 in FIG. 2, although the scale differs.

Each column portion CL is provided in the memory hole MH provided in the stack 2. The memory hole MH penetrates through the stack 2 from the top end of the stack 2 along the stacking direction of the stack 2 (Z-axis direction) and extends in the stack 2 and in the semiconductor portion 13. Each column portion CL includes the semiconductor body 210 as a semiconductor column, the memory film 220, and the core layer 230 as illustrated in FIGS. 3 and 4. The semiconductor body 210 extends in the stack 2 in the stacking direction (Z direction) of the stack 2 and is electrically connected to the semiconductor portion 13. The memory film 220 has a charge trapping portion between the semiconductor body 210 and the electrode film 21. The column portions CL selected one by one from the respective fingers are connected to one bit line BL in common via the contacts Cb in FIG. 1. The column portions CL are provided in the memory cell array 2$m$.

In the stair portion 2$s$ other than the memory cell array 2$m$, a tap region Tap and a stair region SSA are provided. The tap region Tap is provided in a block BLK adjacent to the stair region SSA in the Y-direction with the deep slit ST arranged therebetween. The tap region Tap may be provided between cell regions in the X-direction. The stair region SSA may be also provided between the cell regions in the X-direction. The stair region SSA is a region where a plurality of contact plugs CC are provided. The stair region SSA may include a bridge region electrically connecting the word lines WL in the plural blocks BLK that are adjacent to each other in the X-direction with the stair region SSA arranged therebetween. The tap region Tap is a region where a contact plug C4 is provided. The contact plugs CC and C4 each extend in the Z-axis direction, for example. Each contact plug CC is electrically connected to, for example, the electrode film 21 (that is, the word line WL). The contact plug C4 is electrically connected to, for example, the wire 11$a$ for power supply to the transistor Tr or the like. A low-resistance metal such as copper or tungsten is used for the contact plugs CC and C4. The shallow slits SHE extend in the memory cell array 2$m$ in the X-direction and electrically isolate the drain-side selection gate SGD for every finger.

A plurality of insulator columns HR are provided around the contact plug CC. Each insulator column HR is provided in a hole provided in the stack 2. The insulator column HR penetrates through the stack 2 from the top end of the stack 2 along the Z-axis direction and is provided in the stack 2 and in the semiconductor portion 13. An insulator such as a silicon oxide film is used for the insulator column HR. Each insulator column HR may have the same configuration as the column portion CL. The insulator columns HR are provided in the tap region Tap and the stair region SSA, for example. The insulator columns HR serve as support members for maintaining gaps formed in the stair region and the tap region in replacement of sacrifice films (not illustrated) with the electrode film 21 (in a replacement process). The insulator column HR has a larger diameter (width in the X-direction or the Y-direction) than the column portion CL.

Figure 6:
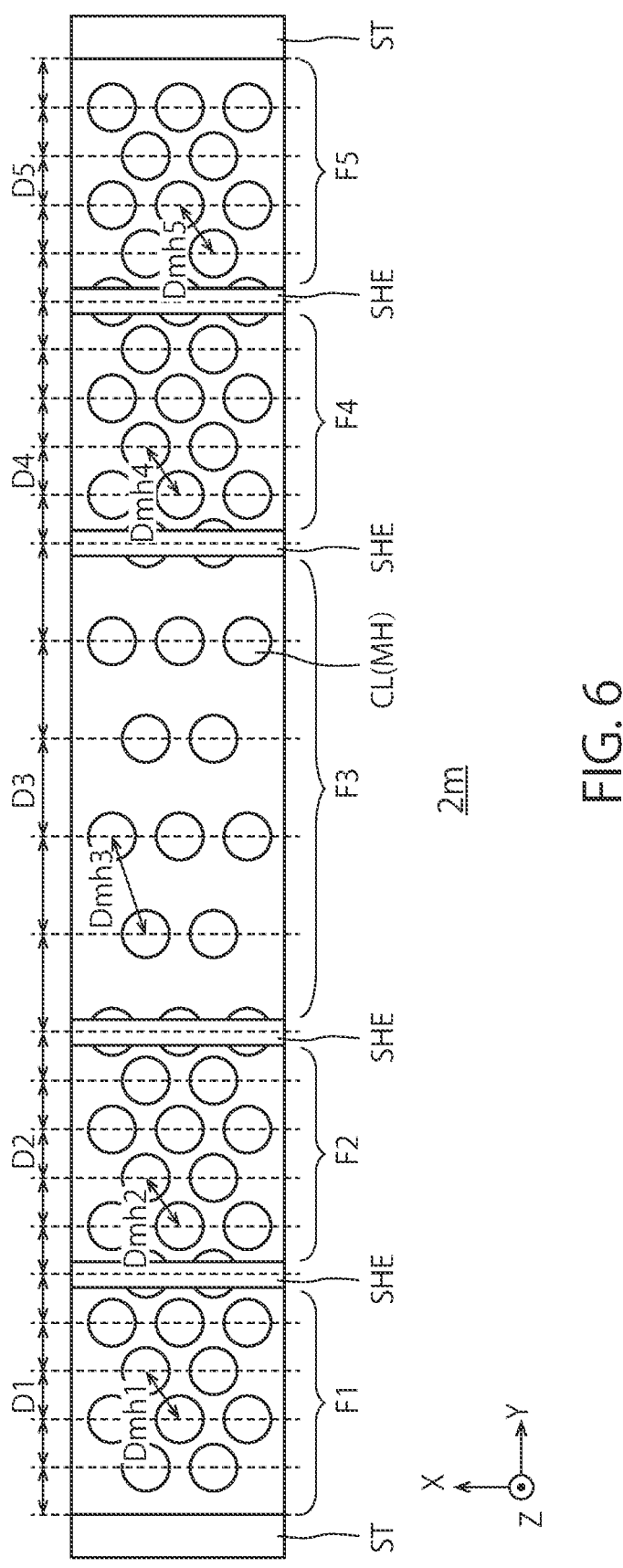
FIG. 6 is a plan view illustrating a configuration example of a portion of the memory cell array according to the first embodiment.

FIG. 6 is a plan view illustrating a configuration example of a portion of the memory cell array 2$m$ according to the first embodiment. FIG. 6 illustrates a planar layout of the column portions CL (the memory holes MH) between two slits ST adjacent to each other. That is, FIG. 6 illustrates an arrangement of the column portions CL (the memory holes MH) in one block.

In the present embodiment, an interval between the adjacent column portions CL differs based on the distance from the slit ST in plan view as viewed in the Z-direction. For example, in end portions of a region between the adjacent slits ST (both end portions of the block), intervals between the adjacent column portions CL (first intervals) in fingers F1 and F5 that are the closest to those slits ST and fingers F2 and F4 that are the second closest to those slits ST are Dmh1, Dmh5, Dmh2, and Dmh4, respectively. The column portions CL are arranged substantially evenly in the same finger F1, F2, F4, or F5. Therefore, in the same finger F1, F2, F4, or F5, it is preferable that the intervals Dmh1, Dmh2, Dmh4, or Dmh5 are substantially equal and substantially uniform, although they may differ slightly.

The intervals Dmh1 and Dmh5 between the column portions CL provided between the slit ST and the slit SHE adjacent to that slit ST in the Y-direction and the intervals Dmh2 and Dmh4 between the slits SHE adjacent to each other are different from an interval Dmh3 between the column portions CL provided between the adjacent slits SHE located in a center portion of the region between the slits ST. The interval Dmh3 is wider than the intervals Dmh1, Dmh2, Dmh4, and Dmh5.

The above-described interval between the column portions CL, for example, the interval Dmh1, refers to an interval from an end of one of the two adjacent column portions CL to an end of the other column portion CL in plan view as viewed in the Z-direction. In a case where the diameters of the column portions CL are substantially equal to each other, however, the interval between the column portions CL may refer to a distance from the center of the one column portion CL to the center of the other column portion CL. The following descriptions will be provided assuming that the diameters of the column portions CL are substantially equal to each other and the interval between the column portions CL is the distance from the center of one of the two adjacent column portions CL to the center of the other column portion CL.

Meanwhile, in the finger F3 that is located in the center portion of the region between the adjacent slits ST (i.e., a center portion of the block) and is farther from the slits ST than the fingers F1, F2, F4, and F5, the interval between the adjacent column portions CL (a second interval) Dmh3 is wider than the intervals Dmh1, Dmh2, Dmh4, and Dmh5. That is, when the intervals Dmh1, Dmh2, Dmh4, and Dmh5 between the column portions CL in the fingers F1, F2, F4, and F5 away from the respective slits ST by first distances and the interval Dmh3 between the column portions CL in the finger F3 away from the slits ST by a second distance larger than the first distances are compared with each other, the interval Dmh3 is wider than the intervals Dmh1, Dmh2, Dmh4, and Dmh5. The column portions CL are arranged substantially evenly in the same finger F3. Therefore, in the same finger F3, it is preferable that the intervals Dmh3 between the adjacent column portions CL are substantially equal to each other and substantially uniform, although they may be slightly different.

As described above, the interval between the adjacent column portions CL is increased as the distance from the slit ST is increased. This is because, in plan view as viewed in the Z-direction, intervals D1 to D5 between the column portions CL in a direction (Y-direction) substantially perpendicular to an extending direction of the slits ST (X-direction) differ according to the distance from the slit ST. The intervals D1 to D5 are intervals between columns of the column portions CL arranged in the X-direction (intervals in the Y-direction). For example, in the end portions of the region between the adjacent slits ST, intervals between columns of the column portions CL, which are adjacent to each other in the Y-direction, in the fingers F1 and F5 that are the closest to the slits ST and the fingers F2 and F4 that are the second closest to the slits ST are D1, D5, D2, and D4, respectively. The intervals D1, D2, D4, and D5 may be different from one another or substantially equal to one another. In the present embodiment, the intervals between the column portions CL in the extending direction of the slits ST (X-direction) (i.e., the intervals between the columns of the column portions CL, which are arranged in the Y-direction) are preferably substantially equal to each other because they affect the interval between the bit lines BL.

Meanwhile, in the finger F3 that is located in the center portion of the region between the adjacent slits ST and is farther from the slits ST than the fingers F1, F2, F4, and F5, an interval (an interval in the Y-direction) between columns of the column portions CL, which are adjacent to each other in the Y-direction, is an interval D3 that is wider than the intervals D1, D2, D4, and D5. That is, when the intervals D1, D2, D4, and D5 between columns of the column portions CL in the fingers F1, F2, F4, and F5 that are away from the respective slits ST by the first distances and the interval D3 between columns of the column portions CL in the finger F3 away from the slits ST by the second distance larger than the first distances are compared with each other, the interval D3 is wider than the intervals D1, D2, D4, and D5. It suffices that the intervals D3 between adjacent columns of the column portions CL in the finger F3 are substantially equal to each other. The interval between columns of the column portions CL is an interval between columns of the column portions CL arranged in the X-direction.

As described above, the interval D3 between columns of the column portions CL in the finger F3 is wider than any of the intervals D1, D2, D4, and D5 between columns of the column portions CL in the fingers F1, F2, F4, and F5. As a result, the interval Dmh3 between the column portions CL adjacent to each other in the finger F3 is wider than any of the intervals Dmh1, Dmh2, Dmh4, and Dmh5 between the column portions CL adjacent to each other in the fingers F1, F2, F4, and F5.

Effects of the semiconductor storage device 100a having the above configuration are described along with a manufacturing method thereof.

A process of forming the memory cell array 2m includes a process of replacing sacrifice films 21c (see FIG. 7) of a stack of the insulation films 22 and the sacrifice films 21c with the electrode films 21 (a replacement process).

FIGS. 7 to 10 are cross-sectional views illustrating an example of a replacement process. In FIGS. 7 to 10, one slit ST and two column portions CL are illustrated side by side for the sake of convenience.

Figure 7:
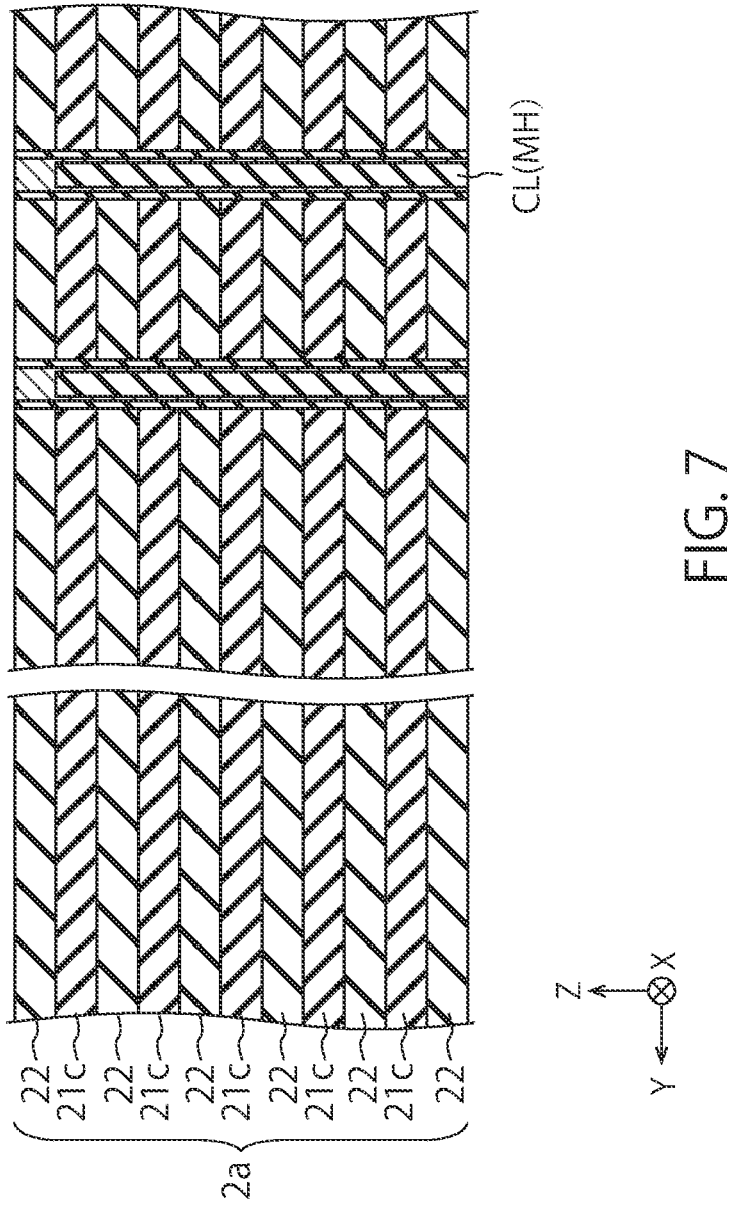
FIGS. 7 to 10 are cross-sectional views illustrating an example of a replacement process.

First, the sacrifice films 21c and the insulation films 22 are alternately stacked to form a stack 2a on the base portion 1 in FIG. 1, as illustrated in FIG. 7. Silicon oxide films, for example, are used as the insulation films 22, and silicon nitride films, for example, are used as the sacrifice films 21c.

Next, the memory holes MH are formed in the stack 2a by lithography and etching, for example. Next, the column portion CL is formed in each memory hole MH.

Figure 8:
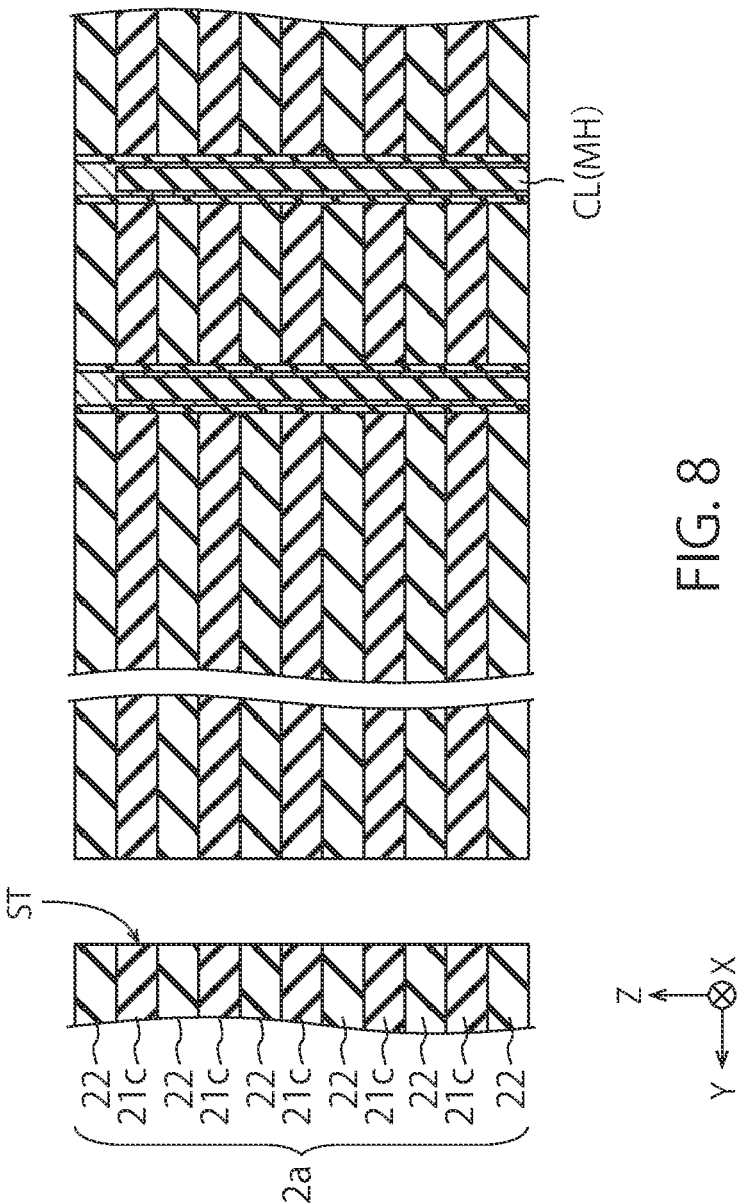

Next, the slit ST is formed to penetrate through the stack 2a by lithography and etching, for example, as illustrated in FIG. 8.

Figure 9:
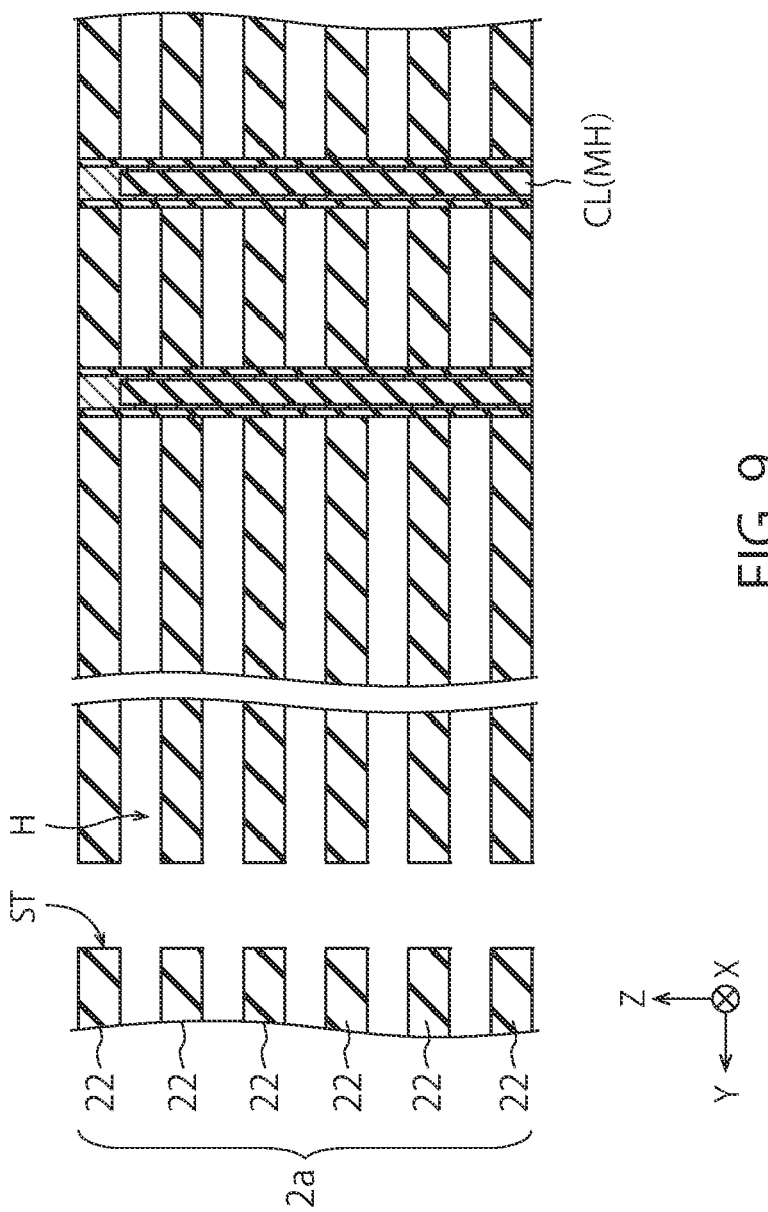

Next, the sacrifice films 21c of the stack 2a are removed via the slit ST by phosphoric acid solution or the like to form spaces H between the insulation films 22 adjacent to each other in the Z-direction, as illustrated in FIG. 9. In each space H, the insulation film 22 and the column portion CL are exposed.

Next, a barrier metal, for example, titanium nitride (TiN) (not illustrated) is deposited on exposed surfaces of the insulation film 22 and the column portion CL in each space H.

Figure 10:
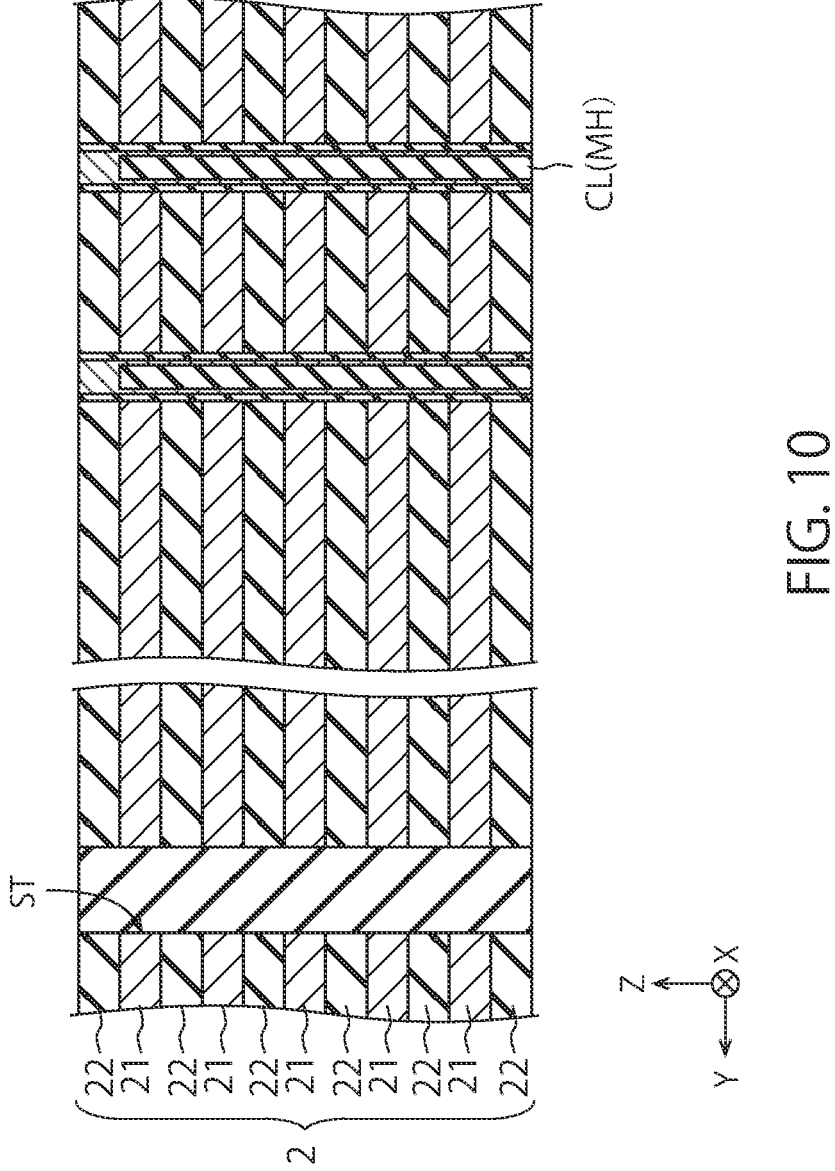

Next, a conductive metal, for example, tungsten (W) is embedded in each space H via the slit ST, as illustrated in FIG. 10. Accordingly, the conductive metal for the electrode film 21 is embedded in the space H between the insulation films 22 adjacent to each other in the Z-direction. A process of replacing the sacrifice films 21c with the electrode films 21 in this manner is called "replacement process".

Thereafter, an interlayer dielectric film, a contact plug, the bit line BL, and the like are formed on the stack 2 to complete the semiconductor storage device 100a according to the present embodiment.

When an interval between the adjacent column portions CL becomes smaller in such a replacement process, the material for the electrode films 21 (e.g., tungsten) is not embedded into a deep portion of each space H through the slit ST, resulting in deterioration of embeddability. In this case, a void remains between the column portion CL and the electrode film 21.

Meanwhile, according to the present embodiment, the interval between the adjacent column portions CL is increased with increase of a distance from the slit ST in plan view as viewed in the Z-direction. For example, the intervals Dmh1, Dmh2, Dmh4, and Dmh5 between the column portions CL in the fingers F1, F2, F4, and F5 that are each relatively close to the slit ST are wider than the interval Dmh3 between the column portions CL in the finger F3 that is relatively far from the slits ST. Accordingly, a gap between the column portions CL in the finger F3 is also wider than those in the fingers F1, F2, F4, and F5. Therefore, the embeddability of the material for the electrode films 21 is improved, and the material for the electrode films 21 is sufficiently embedded into a deep portion of the space H through the slit ST. As a result, a void is hardly generated between the column portion CL and the electrode film 21 which improves the yield.

Further, since the embeddability of the material for the electrode films 21 is improved, a void is hardly generated between the column portion CL and the electrode film 21 even when the interval between the adjacent slits ST is increased, so that reduction of the yield is prevented. As described above, since the interval between the adjacent slits ST can be increased, the density of the column portions CL can be increased.

Second Embodiment

Figure 11:
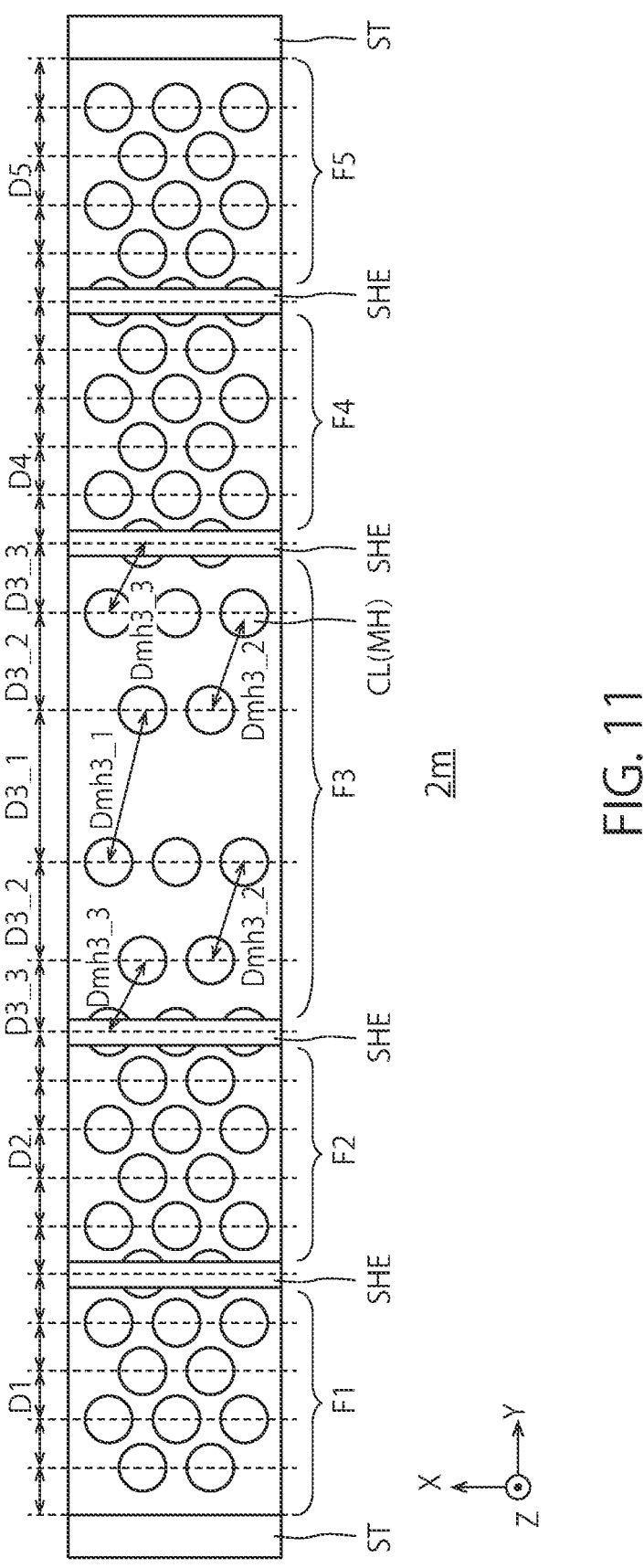
FIG. 11 is a plan view illustrating a configuration example of a portion of the memory cell array according to a second embodiment.

FIG. 11 is a plan view illustrating a configuration example of a portion of the memory cell array 2m according to a second embodiment. FIG. 11 illustrates a planar layout of the column portions CL (the memory holes MH) between two slits ST adjacent to each other.

In the second embodiment, in the finger F3, intervals Dmh3_1 to Dmh3_3 between the column portions CL are increased as being farther from the slits ST and closer to the center of the block between the slits ST. For example, in the finger F3, the interval Dmh3_3 between the column portions CL, which is the closest to the slit ST, is the narrowest. The interval Dmh3_2 between the column portions CL, which is the second closest to the slit ST, is the second narrowest. The interval Dmh3_1 between the column portions CL, which is the farthest from the slit ST, is the widest. As described above, the intervals between the column portions CL are increased as being farther from the slit ST (i.e., as being closer to the center portion of the block between the slits ST).

Further, in the finger F3, intervals D3_1 to D3_3 between columns of the column portions CL are increased as being farther from the nearest slit ST and closer to the center of the block between the slits ST. For example, in the finger F3, the interval D3_3 between columns of the column portions CL, which is the closest to the slit ST, is the narrowest. The interval D3_2 between columns of the column portions CL, which is the second closest to the slit ST, is the second narrowest. The interval D3_1 between columns of the column portions CL, which is the farthest from the slit ST, is the widest. As described above, the intervals between columns of the column portions CL are also increased as being farther from the slit ST (i.e., as being closer to the center portion of the block between the slits ST). Since the manufacturing method according to the second embodiment can be easily understood from the manufacturing method according to the first embodiment, explanations of the manufacturing method according to the second embodiment are omitted here.

As described above, the embeddability of the material for the electrode films 21 in a replacement process is further improved due to gradual increase of the intervals between the column portions CL or the intervals between columns of the column portions CL with increase of the distance from the slit ST.

The rest of the configurations of the second embodiment may be identical to those of the first embodiment. Therefore, the second embodiment can obtain effects identical to those of the first embodiment.

Third Embodiment

Figure 12:
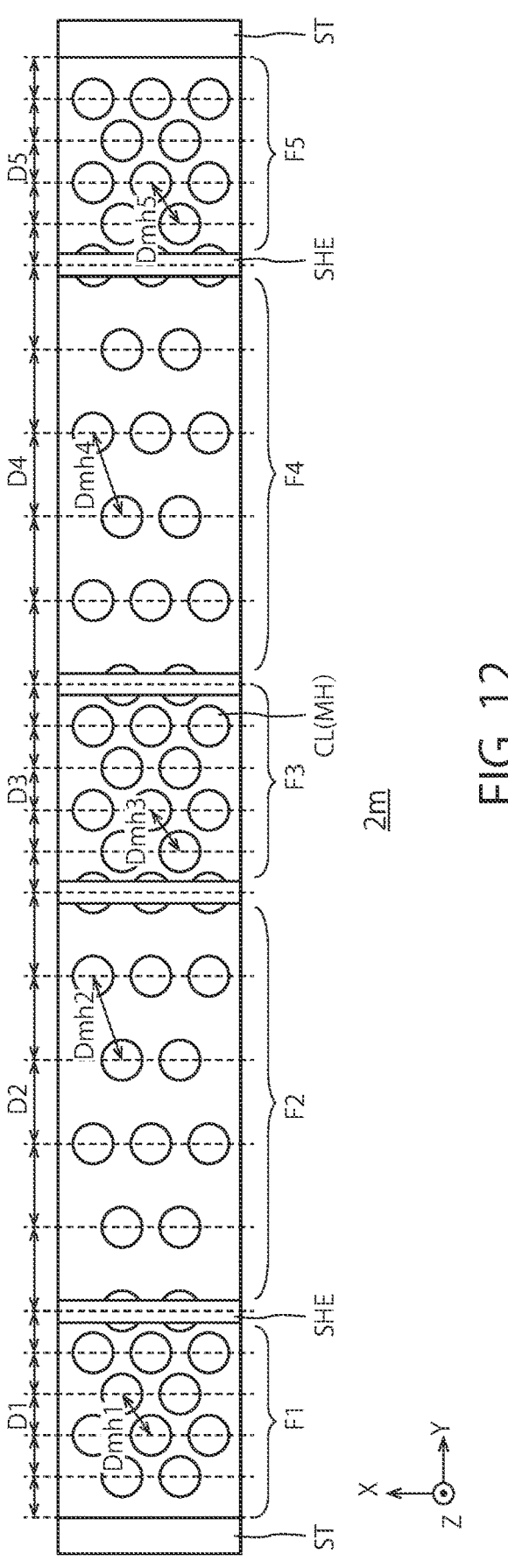
FIG. 12 is a plan view illustrating a configuration example of a portion of the memory cell array according to a third embodiment.

FIG. 12 is a plan view illustrating a configuration example of a portion of the memory cell array 2m according to a third embodiment. In the third embodiment, the intervals Dmh2 and Dmh4 between the column portions CL in the fingers F2 and F4 are wider than the intervals Dmh1, Dmh3, and Dmh5 between the column portions CL in the remaining fingers F1, F3, and F5. That is, the intervals Dmh2 and Dmh4 between the column portions CL in the fingers F2 and F4 that are the second closest to the slits ST or the second farthest from the slits ST are the widest. In this manner, the intervals Dmh2 and Dmh4 between the column portions CL in the interme- diate fingers F2 and F4 that are other than the fingers F1 and F5 closest to the slits ST and the finger F3 farthest from the slits ST may be the widest.

Further, the intervals D2 and D4 between columns of the column portions CL in the fingers F2 and F4 are wider than the intervals D1, D3, and D5 between columns of the column portions CL in the remaining fingers F1, F3, and F5. That is, the intervals D2 and D4 between columns of the column portions CL in the fingers F2 and F4 that are the second closest to the slits ST or the second farthest from the slits ST are the widest. The intervals D2 and D4 between columns of the column portions CL in the intermediate fingers F2 and F4 that are other than the fingers F1 and F5 closest to the slits ST and the finger F3 farthest from the slits ST are the widest.

Even in this configuration, the material for the electrode films 21 in a replacement process can easily pass in the fingers F2 and F4, so that the embeddability can be improved.

Fourth Embodiment

Figure 13:
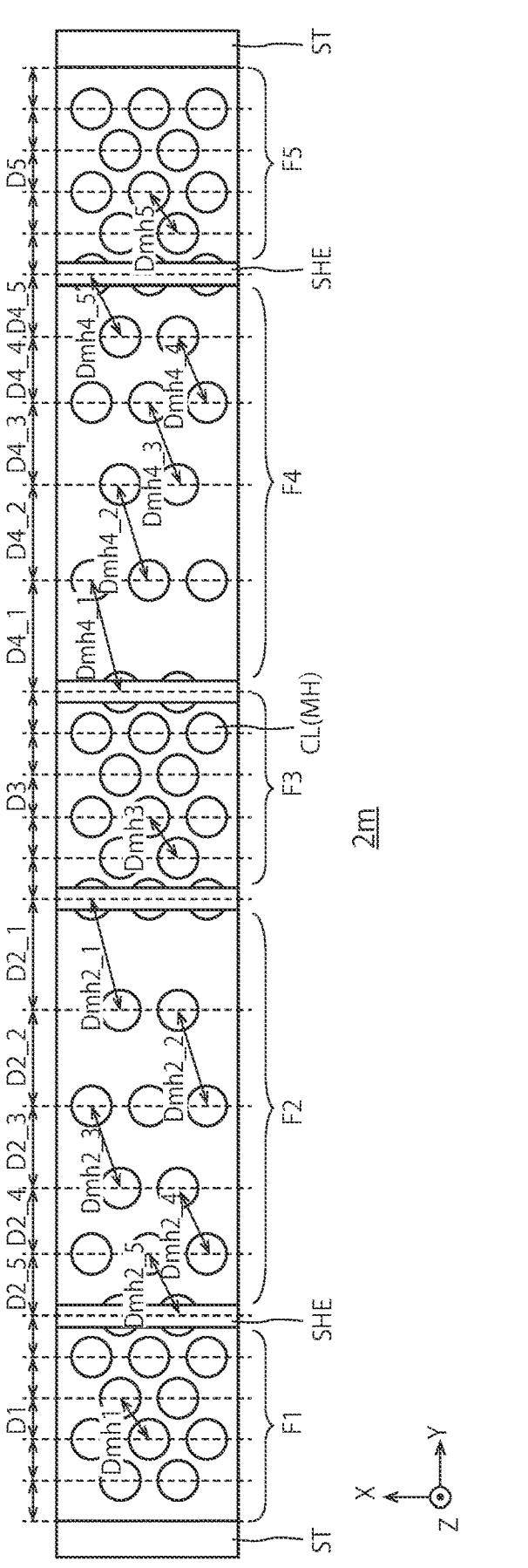
FIG. 13 is a plan view illustrating a configuration example of a portion of the memory cell array according to a fourth embodiment.

FIG. 13 is a plan view illustrating a configuration example of a portion of the memory cell array 2m according to a fourth embodiment. The fourth embodiment is a combina- tion of the second embodiment and the third embodiment. Therefore, in the finger F2, intervals Dmh2_1 to Dmh2_5 between the column portions CL are increased as being farther from the slit ST and closer to the center of the block between the slits ST in the fourth embodiment. For example, in the finger F2, the interval Dmh2_5 between the column portions CL, which is the closest to the slit ST, is the narrowest. The interval Dmh2_4 between the column por- tions CL, which is the second closest to the slit ST, is the second narrowest. Further, the intervals Dmh2_3 and Dmh2_2 between the column portions CL gradually become smaller as being farther from the slit ST. The interval Dmh2_1 between the column portions CL, which is the farthest from the slit ST, is the widest. As described above, the intervals between the column portions CL are increased as being farther from the slit ST (i.e., approach closer to the center portion of the block between the slits ST).

The above descriptions are also applied to the finger F4. In the finger F4, intervals Dmh4_1 to Dmh4_5 between the column portions CL are increased as being farther from the slit ST and closer to the center of the block between the slits ST. For example, in the finger F4, the interval Dmh4_5 between the column portions CL, which is the closest to the slit ST, is the narrowest. The interval Dmh4_4 between the column portions CL, which is the second closest to the slit ST, is the second narrowest. Further, the intervals Dmh4_3 and Dmh4_2 between the column portions CL are gradually reduced as being farther from the slit ST. The interval Dmh4_1 between the column portions CL, which is the farthest from the slit ST, is the widest. As described above, the intervals between the column portions CL are increased as being farther from the slit ST (i.e., as being closer to the center portion of the block between the slits ST).

Further, in the fingers F2 and F4, intervals D2_1 to D2_5 and D4_1 to D4_5 between columns of the column portions CL are increased as being farther from the slit ST and closer to the center of the block between the slits ST. For example, in the finger F2, the interval D2_5 between columns of the column portions CL, which is the closest to the slit ST, is the narrowest. The interval D2_4 between columns of the col- umn portions CL, which is the second closest to the slit ST, is the second narrowest. The interval D2_1 between columns of the column portions CL, which is the farthest from the slit ST, is the widest.

In the finger F4, the interval D4_5 between columns of the column portions CL, which is the closest to the slit ST, is the narrowest. The interval D4_4 between columns of the col- umn portions CL, which is the second closest to the slit ST, is the second narrowest. The interval D4_1 between columns of the column portions CL, which is the farthest from the slit ST, is the widest.

As described above, the intervals between columns of the column portions CL are also increased as being farther from the slit ST (i.e., as being closer to the center portion of the block between the slits ST).

The embeddability of the material for the electrode films 21 in a replacement process is further improved due to gradual increase of the intervals between the column por- tions CL or the intervals between columns of the column portions CL with increase of the distance from the slit ST.

The rest of the configurations of the fourth embodiment may be identical to those of the third embodiment. Therefore, the fourth embodiment can obtain effects identical to those of the third embodiment.

Fifth Embodiment

Figure 14:
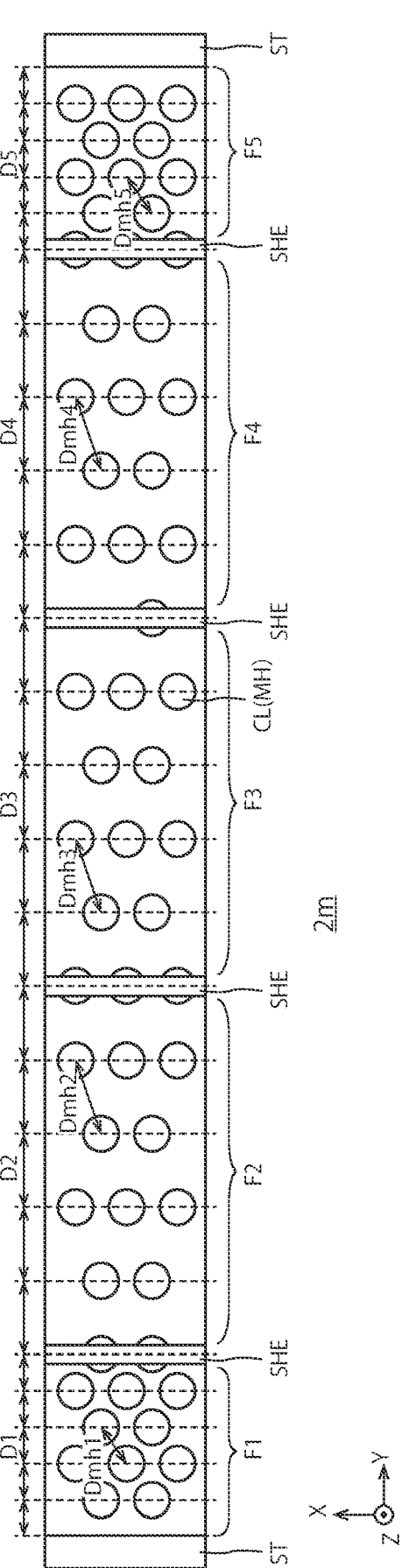
FIG. 14 is a plan view illustrating a configuration example of a portion of the memory cell array according to a fifth embodiment.

FIG. 14 is a plan view illustrating a configuration example of a portion of the memory cell array 2*m* according to a fifth embodiment. The fifth embodiment is a combination of the first embodiment and the third embodiment. Therefore, in the fifth embodiment, the intervals Dmh2 to Dmh4 between the column portions CL in the fingers F2 to F4 are wider than both the intervals Dmh1 and Dmh5 between the column portions CL in the fingers F1 and F5. The intervals Dmh2 to Dmh4 may be different from one another or substantially equal to one another. Further, the intervals Dmh1 and Dmh5 may be different from each other or substantially equal to each other.

In addition, the intervals D2 to D4 in the Y-direction between columns of the column portions CL in the fingers F2 to F4 are wider than both the intervals D1 and D5 in the Y-direction between columns of the column portions CL in the fingers F1 and F5. The intervals D2 to D4 may be different from one another or substantially equal to one another. Further, the intervals D1 and D5 may be also different from each other or substantially equal to each other.

According to the fifth embodiment, in plan view as viewed in the Z-direction, the intervals Dmh1 and Dmh5 between the column portions CL in the fingers F1 and F5 that are relatively close to the respective slits ST are wider than the intervals Dmh2 to Dmh4 between the column portions CL in the fingers F2 to F4 that are relatively far from the respective slits ST. Further, the intervals D1 and D5 between columns of the column portions CL in the fingers F1 and F5 are wider than the intervals D2 to D4 between columns of the column portions CL in the fingers F2 to F4. Accordingly, the embeddability of the material for the electrode films 21 is further improved.

The rest of the configurations of the fifth embodiment may be identical to those of the first or third embodiment. Therefore, the fifth embodiment can obtain effects identical to those of the first or third embodiment.

Sixth Embodiment

Figure 15:
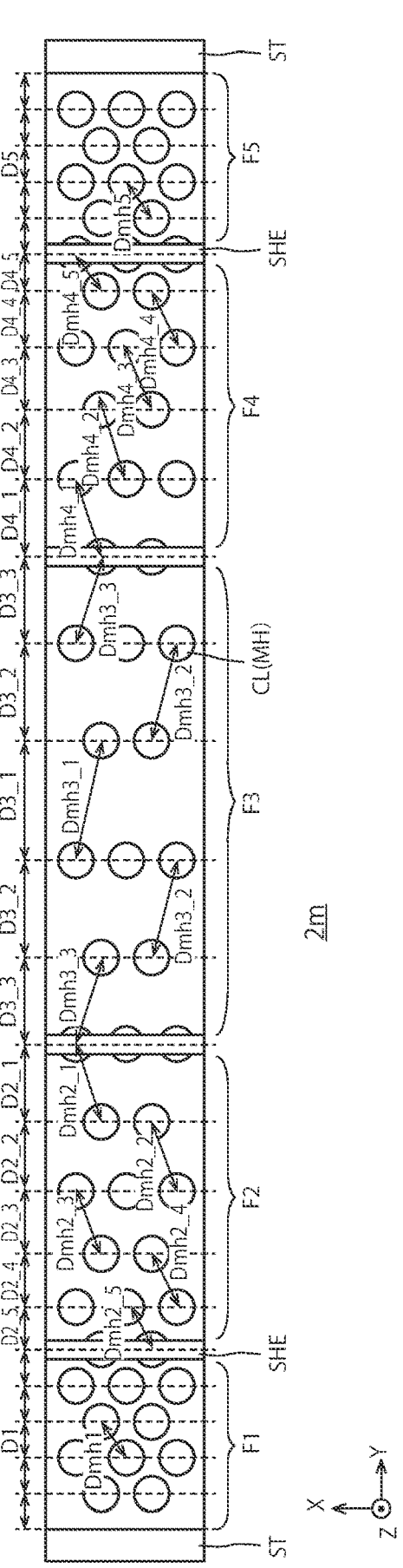
FIG. 15 is a plan view illustrating a configuration example of a portion of the memory cell array according to a sixth embodiment.

FIG. 15 is a plan view illustrating a configuration example of a portion of the memory cell array 2*m* according to a sixth embodiment. The sixth embodiment is a combination of the second embodiment and the fourth embodiment. FIG. 15 illustrates a planar layout of the column portions CL (the memory holes MH) between two slits ST adjacent to each other.

In the sixth embodiment, in the fingers F2 to F4, the intervals Dmh2_1 to Dmh2_5, Dmh3_1 to Dmh3_3, and Dmh4_1 to Dmh4_5 between the column portions CL are increased as being farther from the slit ST and closer to the center of the block between the slits ST. For example, in the fingers F2 to F4, the intervals Dmh2_5 and Dmh4_5 between the column portions CL, which are the closest to the respective slits ST, are the narrowest. The intervals Dmh2_4 and Dmh4_4 between the column portions CL, which are the second closest to the respective slits ST, are the second narrowest. The interval Dmh3_1 between the column portions CL, which is the farthest from the slits ST and is located in the center portion of the block between the slits ST, is the widest. As described above, the intervals between the column portions CL are gradually increased as being farther from the slit ST (i.e., as being closer to the center portion of the block between the slits ST).

Further, in the fingers F2 to F4, the intervals D2_1 to D2_5, D3_1 to D3_3, and D4_1 to D4_5 between columns of the column portions CL are increased as being farther from the respective slits ST and closer to the center of the block between the slits ST. For example, in the fingers F2 to F4, the intervals D2_5 and D4_5 between columns of the column portions CL, which are the closest to the respective slits ST, are the narrowest. The intervals D2_4 and D4_4 between columns of the column portions CL, which are the second closest to the respective slits ST, are the second narrowest. The interval D3_1 between columns of the column portions CL, which is the farthest from the slits ST, is the widest. As described above, the intervals between columns of the column portions CL are also increased gradually as being farther from the slit ST (i.e., as being closer to the center portion of the block between the slits ST).

As described above, the embeddability of the material for the electrode films 21 in a replacement process is further improved due to gradual increase of the intervals between the column portions CL or the intervals between columns of the column portions CL with increase of the distance from the slit ST.

The rest of the configurations of the sixth embodiment may be identical to those of the second or fourth embodiment. Therefore, the sixth embodiment can obtain effects identical to those of the second or fourth embodiment.

Seventh Embodiment

Figure 16:
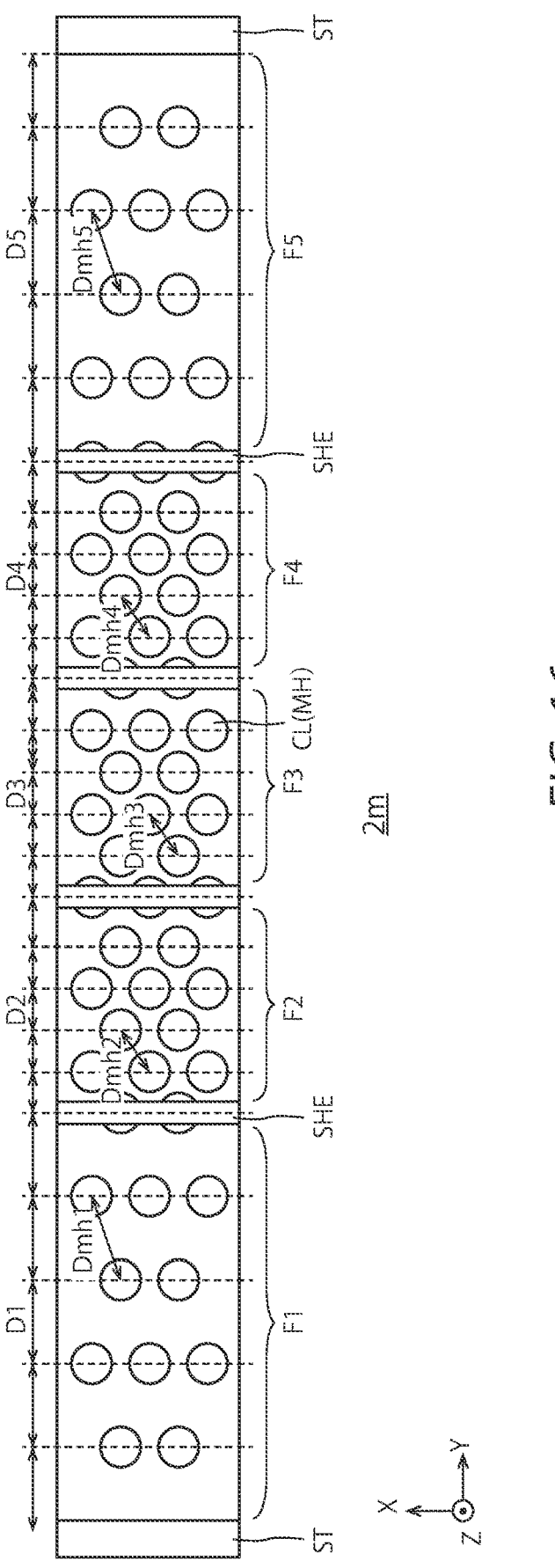
FIG. 16 is a plan view illustrating a configuration example of a portion of the memory cell array according to a seventh embodiment.

FIG. 16 is a plan view illustrating a configuration example of a portion of the memory cell array 2*m* according to a seventh embodiment. In the seventh embodiment, the intervals Dmh1 and Dmh5 between the column portions CL in the fingers F1 and F5 are wider than the intervals Dmh2 to Dmh4 between the column portions CL in the remaining fingers F2 to F4. That is, the intervals Dmh1 and Dmh5 between the column portions CL in the fingers F1 and F5 that are in end portions closest to the respective slits ST are the widest. The intervals Dmh2 to Dmh4 between the column portions CL in the fingers F2 to F4 that are in the center portion of a block between the slits ST are narrower than the intervals Dmh1 and Dmh5. When it is assumed that the fingers F1 and F5 are away from the respective slits ST by the first distance, the intervals Dmh2 to Dmh4 between the column portions CL in the fingers F2 to F4 that are away from the respective slits ST by the second distances larger than the first distance are narrower than the intervals Dmh1 and Dmh5 between the column portions CL in the fingers F1 and F5. In the present embodiment, each of the intervals Dmh1 to Dmh5 between the column portions CL is substantially uniform in a corresponding one of the fingers F1 to F5. As described above, the intervals Dmh1 and Dmh5 between the column portions CL in the fingers F1 and F5 closest to the respective slits ST may be the widest. Also in this case, the embeddability of the material for the electrode films 21 in a replacement process is improved.

Further, the intervals D1 and D5 between columns of the column portions CL in the fingers F1 and F5 are wider than the intervals D2 to D4 between columns of the column portions CL in the remaining fingers F2 to F4. That is, the intervals D1 and D5 between columns of the column portions CL in the fingers F1 and F5 that are the closest to the respective slits ST are the widest. In the present embodiment, each of the intervals D1 to D5 between columns of the column portions CL is substantially uniform in a corresponding one of the fingers F1 to F5.

Even in this configuration, the material for the electrode films 21 in a replacement process can easily pass in the fingers F1 and F5, thereby improving the embeddability.

Eighth Embodiment

Figure 17:
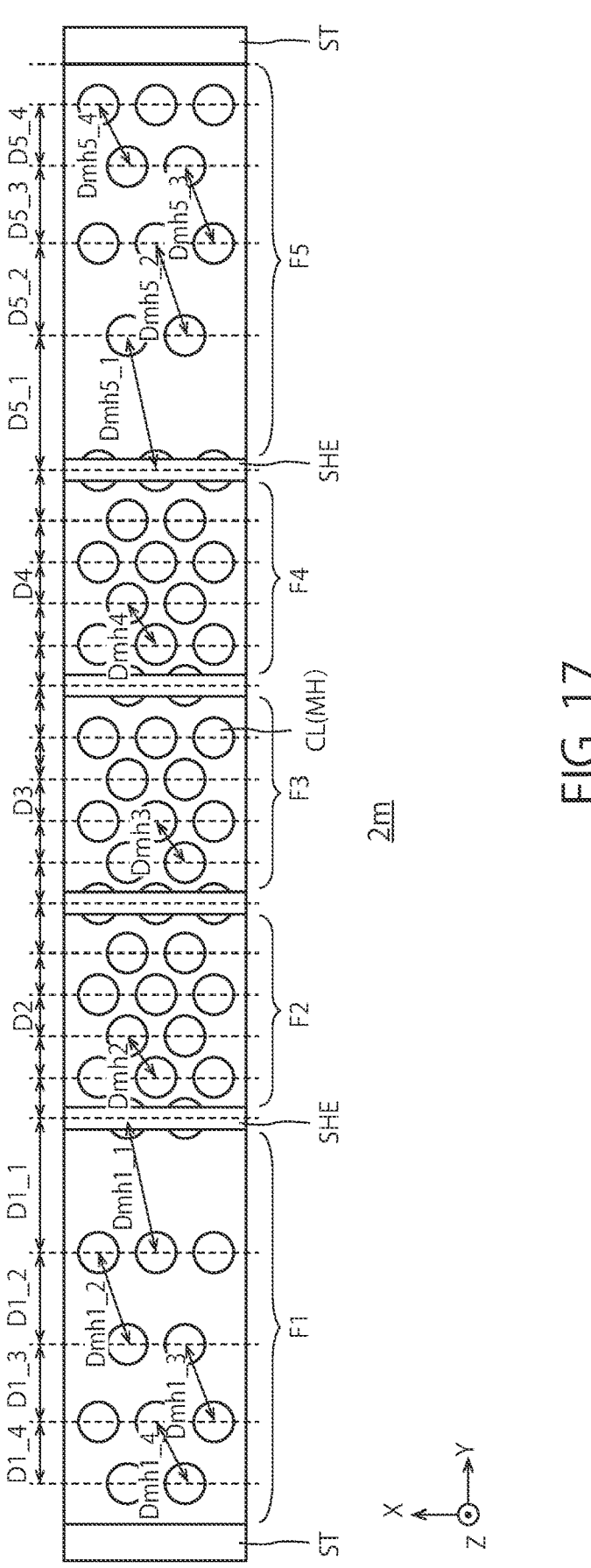
FIG. 17 is a plan view illustrating a configuration example of a portion of the memory cell array according to an eighth embodiment.

FIG. 17 is a plan view illustrating a configuration example of a portion of the memory cell array 2m according to an eighth embodiment. The eighth embodiment is a combination of the second embodiment and the seventh embodiment. Therefore, in the eighth embodiment, in the fingers F1 and F5, intervals Dmh1_1 to Dmh1_4 and Dmh5_1 and Dmh5_4 between the column portions CL are increased as being farther from the respective slits ST and closer to the center of the block between the slits ST. For example, in the finger F1, the interval Dmh1_4 between the column portions CL, which is the closest to the slit ST, is the narrowest. The interval Dmh1_3 between the column portions CL, which is the second closest to the slit ST, is the second narrowest. Further, the intervals between the column portions CL are gradually increased as being farther from the slit ST. The interval Dmh1_1 between the column portions CL, which is the farthest from the slit ST, is the widest. As described above, the intervals between the column portions CL are increased as being farther from the slit ST (i.e., as being closer to the center portion of the block between the slits ST).

The above descriptions are also applied to the finger F5. In the finger F5, the intervals Dmh5_1 to Dmh5_4 between the column portions CL are increased as being farther from the slit ST and closer to the center of the block between the slits ST. For example, in the finger F5, the interval Dmh5_4 between the column portions CL, which is the closest to the slit ST, is the narrowest. The interval Dmh5_3 between the column portions CL, which is the second closest to the slit ST, is the second narrowest. Further, the intervals between the column portions CL are gradually increased, as being farther from the slit ST. The interval Dmh5_1 between the column portions CL, which is the farthest from the slit ST, is the widest. As described above, the intervals between the column portions CL are increased as being farther from the slit ST (i.e., as being closer to the center portion of the block between the slits ST).

Further, in the fingers F1 and F5, intervals D1_1 to D1_4 and D5_1 to D5_4 between columns of the column portions CL are increased as being farther from the respective slits ST and closer to the center of the block between the slits ST. For example, in the finger F1, the interval D1_4 between columns of the column portions CL, which is the closest to the slit ST, is the narrowest. The interval D1_3 between columns of the column portions CL, which is the second closest to the slit ST, is the second narrowest. The interval D1_1 between columns of the column portions CL, which is the farthest from the slit ST, is the widest.

In the finger F5, the interval D5_4 between columns of the column portions CL, which is the closest to the slit ST, is the narrowest. The interval D5_3 between columns of the column portions CL, which is the second closest to the slit ST, is the second narrowest. The interval D5_1 between columns of the column portions CL, which is the farthest from the slit ST, is the widest.

As described above, the intervals between columns of the column portions CL are also increased as being farther from the slit ST (i.e., as being closer to the center portion of the block between the slits ST).

The embeddability of the material for the electrode films 21 in a replacement process is further improved due to gradual increase of the intervals between the column portions CL or the intervals between columns of the column portions CL with increase of the distance from the slit ST.

The rest of the configurations of the eighth embodiment may be identical to those of the seventh embodiment. Therefore, the eighth embodiment can obtain effects identical to those of the seventh embodiment.

Ninth Embodiment

Figure 18:
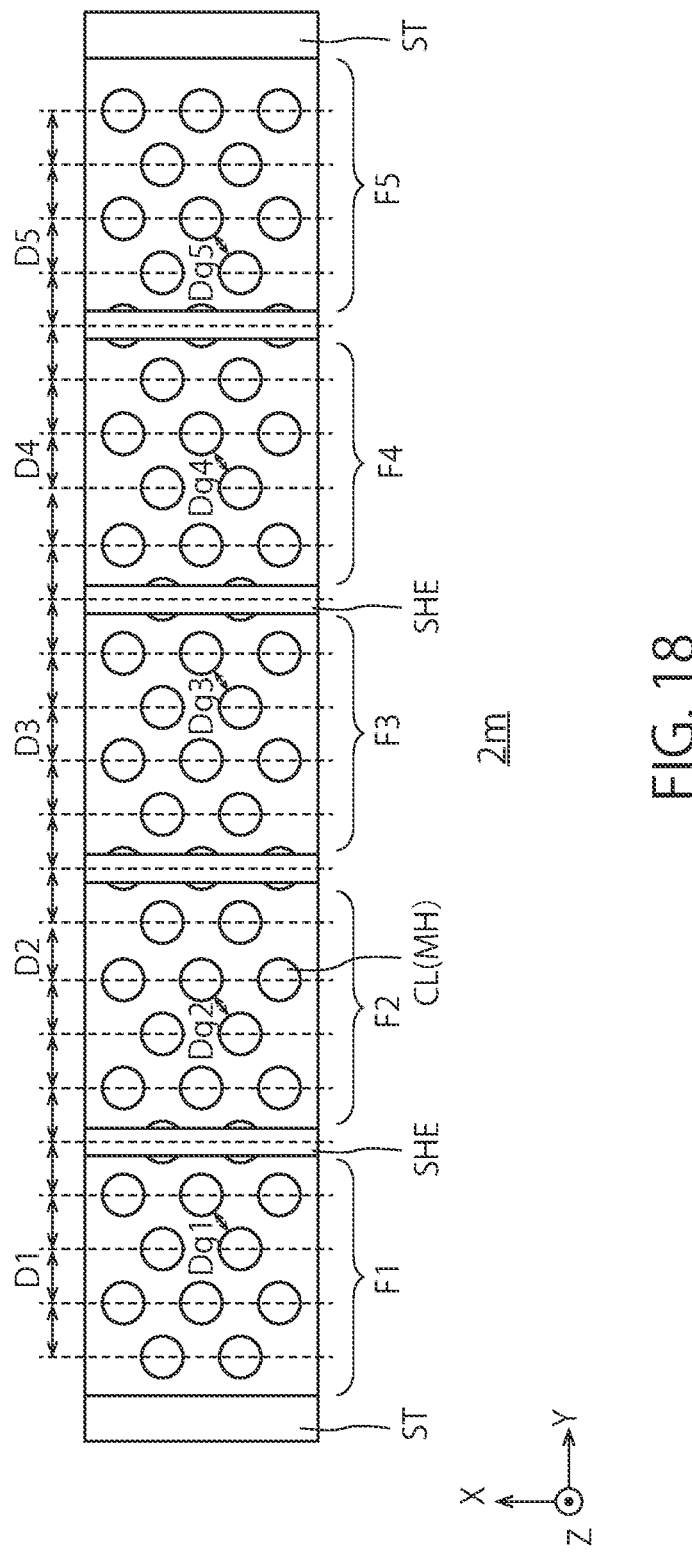
FIG. 18 is a plan view illustrating a configuration example of a portion of the memory cell array according to a ninth embodiment.

FIG. 18 is a plan view illustrating a configuration example of a portion of the memory cell array 2m according to a ninth embodiment. In the above embodiments, gaps between the column portions CL are changed by changing the intervals Dmh1 to Dmh5 between the column portions CL. Meanwhile, in the ninth embodiment, the diameter of the column portion CL itself is smaller than that in the other embodiments in plan view as viewed in the Z-direction. In the ninth embodiment, the intervals Dmh1 to Dmh5 between the column portions CL hardly changed irrespective of the distance from the respective slits ST. However, since the diameter of the column portion CL is smaller than that in the other embodiments, gaps Dg1 to Dg5 from an end portion of one of the two adjacent column portions CL to an end portion of the other column portion CL are increased. Accordingly, the embeddability of the material for the electrode films 21 in a replacement process is improved.

Figure 19:
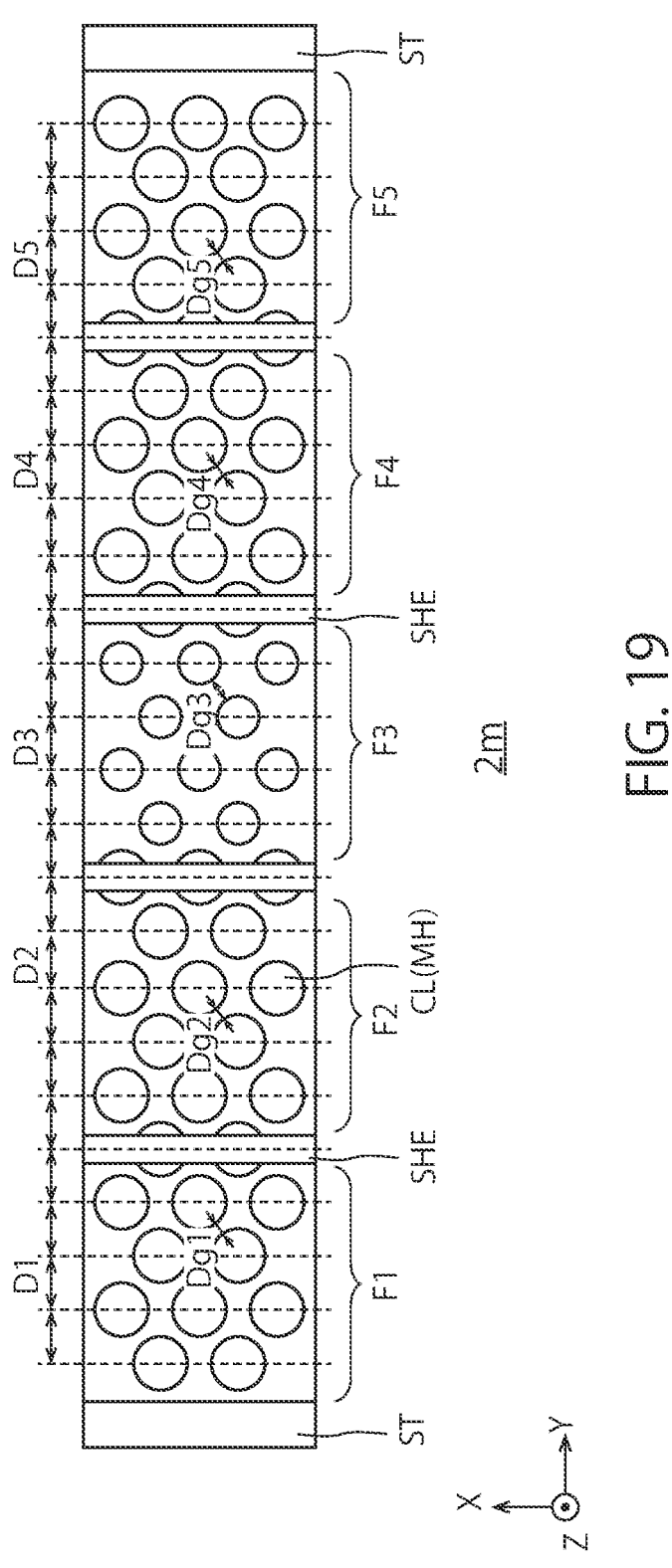
FIG. 19 is a plan view illustrating a configuration example of a portion of the memory cell array according to a first modification of the ninth embodiment.

In FIG. 18, the diameter of the column portions CL in all the fingers F1 to F5 are reduced. However, only the diameter of the column portions CL in a part of the fingers may be reduced. For example, the diameter of the column portions CL may differ according to the distance from the slit ST. FIG. 19 is a plan view illustrating a configuration example of a portion of the memory cell array 2m according to a first modification of the ninth embodiment. In the first modification, the diameter of the column portions CL in the finger F3 is reduced. The diameter of the column portions CL in the finger F3 that is far from the slits ST (a second diameter) is smaller than the diameter of the column portions CL in the fingers F1, F2, F4, and F5 that are close to the respective slits ST (a first diameter). That is, the diameter of the column portions CL in end portions of a region between the adjacent slits ST is the first diameter, and the diameter of the column portions CL in the center portion of the region between the adjacent slits ST is the second diameter smaller than the first diameter. Accordingly, the gap Dg3 in the finger F3 becomes wider than the gaps Dg1, Dg2, Dg4, and Dg5 in the remaining fingers F1, F2, F4, and F5. As a result, the modification of the ninth embodiment can obtain effects identical to those of the first embodiment.

Similarly, when the diameter of the column portions CL in the fingers F2 and F4 is reduced, for example, the gaps Dg2 and Dg4 are increased, although not illustrated. Accordingly, the present modification can obtain effects identical to those of the third embodiment.

For example, when the diameter of the column portions CL in the fingers F2 to F4 is reduced, the gaps Dg2 to Dg4 are increased. Accordingly, the present modification can obtain effects identical to those of the fifth embodiment.

For example, when the diameter of the column portions CL in the fingers F1 and F5 is reduced, the gaps Dg1 and Dg5 are increased. The present modification can obtain effects identical to those of the seventh embodiment.

Figure 20A:
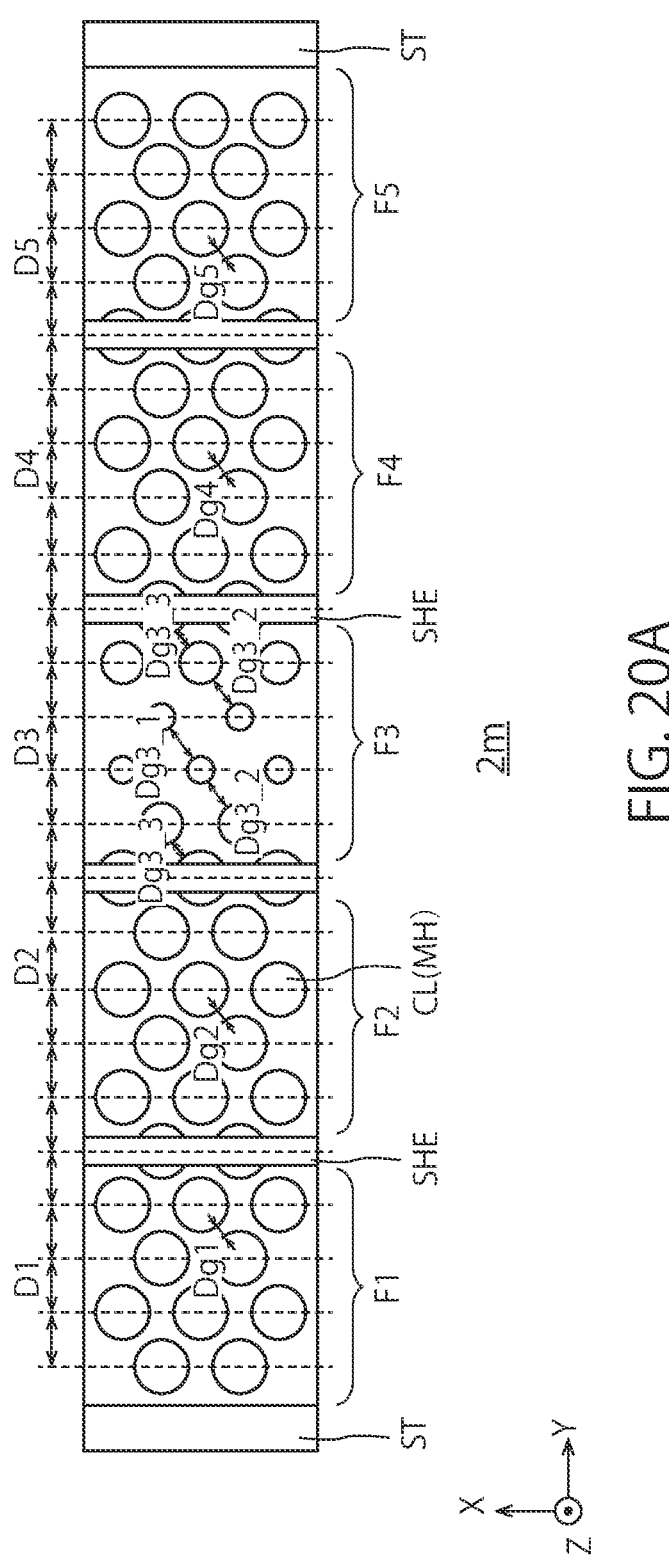
FIG. 20A is a plan view illustrating a configuration example of a portion of the memory cell array according to a second modification of the ninth embodiment.

Further, the diameter of the column portions CL may differ according to the distance from the slit ST even in the same finger. For example, the diameter of the column portions CL in the finger F3 is reduced as the distance from the slit ST is increased (i.e., as being closer to the center of the block between the adjacent slits ST). FIG. 20A is a plan view illustrating a configuration example of a portion of the memory cell array 2m according to a second modification of the ninth embodiment. In the second modification, the diameter of the column portions CL in the finger F3 becomes smaller as the distance from the slit ST is increased (i.e., as being closer to the center of the block between the slits ST). Accordingly, gaps Dg3_1 to Dg3_3 are increased as the distance from the slit ST is increased (i.e., the distance to the center of the block between the slits ST is reduced). The gap Dg3_1 is the widest, and the gaps Dg3_2 and Dg3_3 are reduced from the gap Dg3_1 in that order. The gap Dg3_3 is wider than the gaps Dg1, Dg2, Dg4, and Dg5 in the remaining fingers F1, F2, F4, and F5. Accordingly, the second modification can obtain effects identical to those of the second embodiment.

Similarly, the diameter of the column portions CL in the fingers F2 and F4, for example, may be reduced as the distance from the slit ST is increased (i.e., as being closer to the center of the block between the slits ST), although not illustrated. Accordingly, each of the gaps Dg2 and Dg4 is increased as the distance from the slit ST is increased (i.e., as being closer to the distance to the center of the block between the slits ST). Accordingly, the present modification can obtain effects identical to those of the fourth embodiment.

For example, the diameter of the column portions CL in the fingers F2 to F4 may be reduced as the distance from the slit ST is increased (i.e., as being closer to the center of the block between the slits ST). Accordingly, the gaps Dg2 to Dg4 are increased as the distance from the slit ST is increased (i.e., as being closer to the center of the block between the slits ST). Accordingly, the present modification can obtain effects identical to those of the sixth embodiment.

For example, the diameter of the column portions CL in the fingers F1 and F5 may be reduced as the distance from the slit ST is increased (i.e., as being closer the center of the block between the slits ST). Accordingly, the gaps Dg1 and Dg5 are each increased as the distance from the slit ST is increased (i.e., as being closer to the center of the block between the slits ST). Accordingly, the present modification can obtain effects identical to those of the eighth embodiment.

Furthermore, in the above embodiments, the shallow slit SHE is formed on one column of the column portions CL (the memory holes MH) arranged in the X-direction. In this case, memory cells in the column portion CL under the shallow slit SHE are not used as memory cells for storing data therein but exist as dummy cells. However, the shallow slit SHE may be arranged between columns of the column portions CL, which are adjacent to each other in the Y-direction, although not illustrated. In this case, the memory cells in the column portion CL under the shallow slit SHE can be also used as active memory cells for storing data therein. The embodiments described above can be also applied to such a memory cell array 2m.

In the embodiments described above, the column portions CL (the memory holes MH) are arranged in such a manner that the intervals Dmh1 to Dmh5 or the gaps Dg1 to Dg5 are increased as being farther from the slits ST that are adjacent to each other toward the center portion of a region between those slits ST. On the contrary, the column portions CL may be arranged in such a manner that the intervals Dmh1 to Dmh5 or the gaps Dg1 to Dg5 are increased as being closer to either of the slits ST that are adjacent to each other from the center portion of the region between those slits ST, as illustrated in FIG. 16.

Figure 20B:
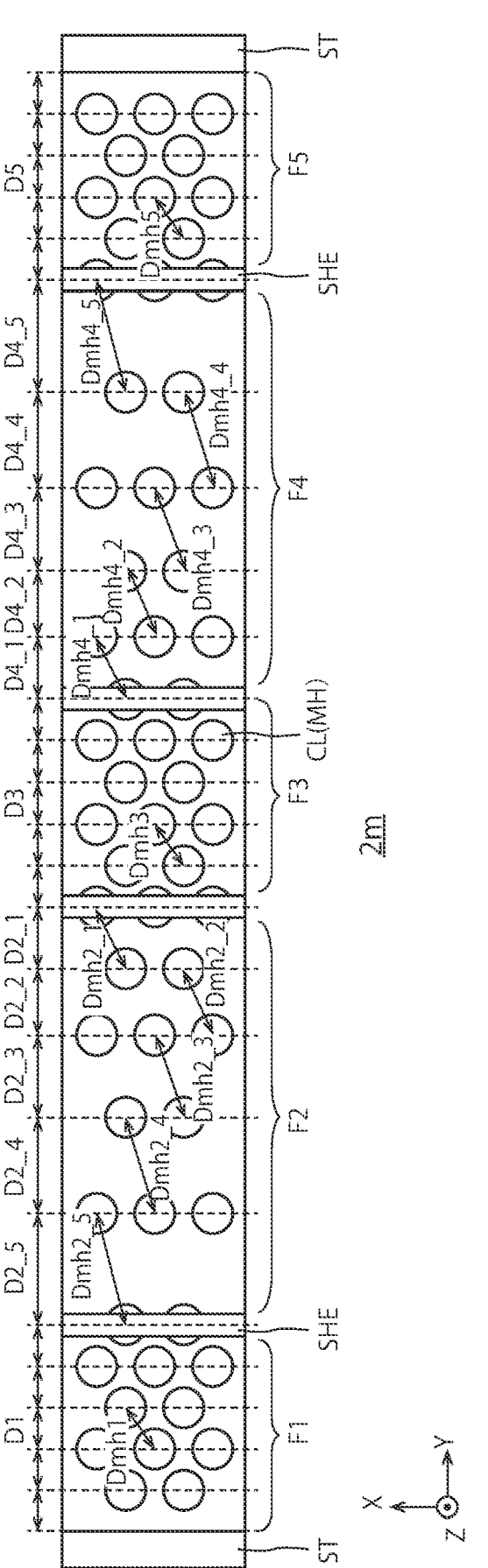
FIG. 20B is a plan view illustrating a configuration example of a portion of the memory cell array according to a tenth embodiment.

FIG. 20B is a plan view illustrating a configuration example of a portion of the memory cell array 2m according to a tenth embodiment. In the tenth embodiment, in each of the fingers F2 and F4, the column portions CL are arranged in such a manner that the intervals Dmh2_1 to Dmh2_5 or Dmh4_1 to Dmh4_5 (or the gaps Dg2 or Dg4 shown in FIG. 20A) in the same finger are gradually increased as being closer to either of the slits ST that are adjacent to each other from the center portion of a region between those slits ST. Even in this configuration, the effects of the present embodiment are not lost. The tendency of intervals between the column portions CL in the tenth embodiment may be applied to any of the embodiments illustrated in FIGS. 11, 15, 17, and 20A.

The embodiments described above may have a configuration in which the base portion 1 including a peripheral circuit (a CMOS circuit) is provided below the stack 2 including the memory cell array 2m, as illustrated in FIG. 1. Further, the embodiments described above may have a configuration in which separate semiconductor substrates, one of which is provided with the base portion 1 including a peripheral circuit (a CMOS circuit) and the other is provided with the stack 2 including the memory cell array 2m, are bonded to each other.

Figure 21:
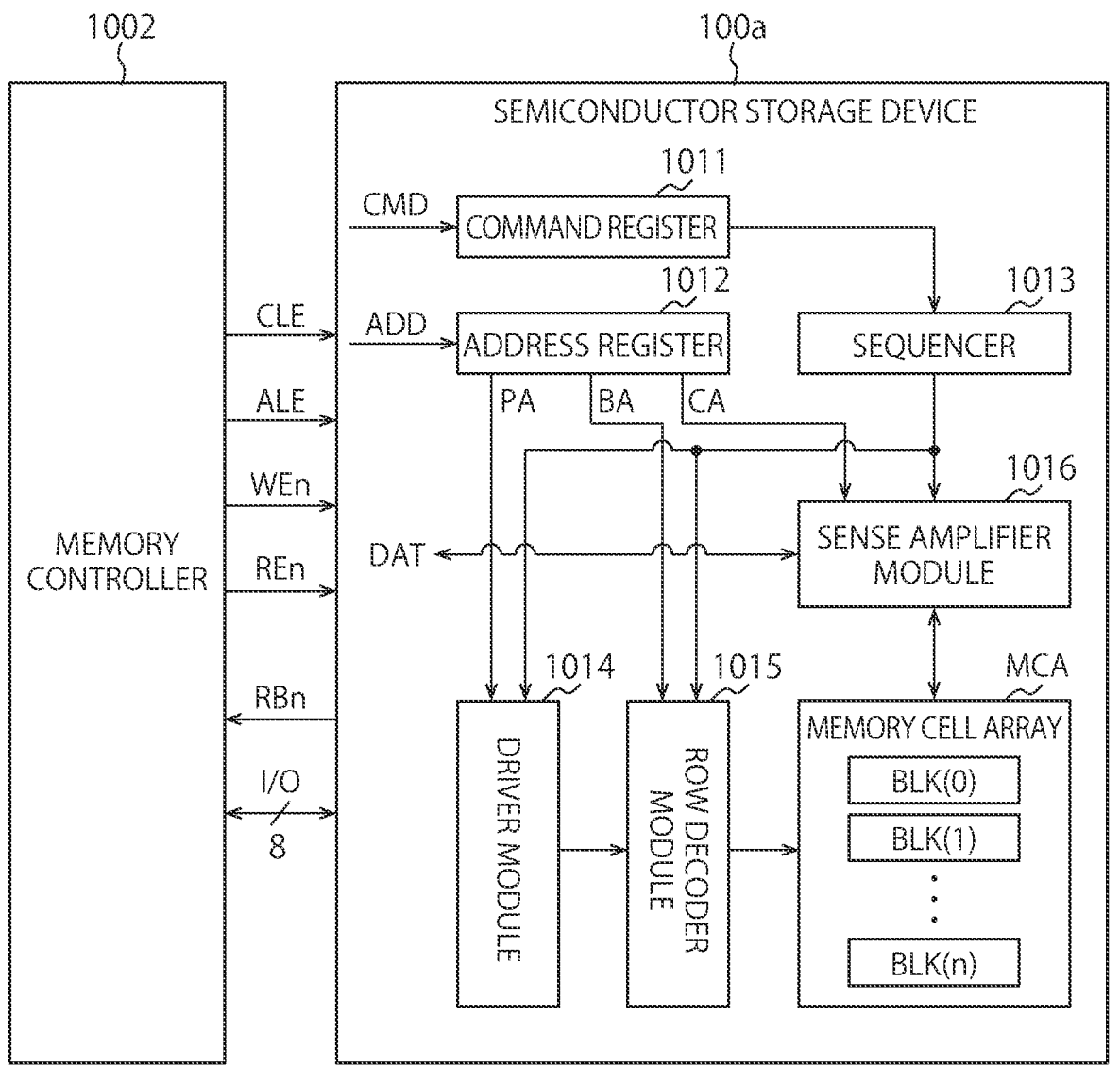
FIG. 21 is a block diagram illustrating a configuration example of a semiconductor storage device to which any of the embodiments described above is applied.

FIG. 21 is a block diagram illustrating a configuration example of a semiconductor storage device to which any of the embodiments described above is applied. The semiconductor storage device 100a is a NAND flash memory that can store therein data in a non-volatile manner, and is controlled by an external memory controller 1002. Communication between the semiconductor storage device 100a and the memory controller 1002 supports, for example, a NAND interface standard.

As illustrated in FIG. 21, the semiconductor storage device 100a includes, for example, a memory cell array MCA, a command resister 1011, an address resister 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). Each block BLK is a set of a plurality of memory cells capable of storing therein data in a non-volatile manner and is used as, for example, the unit of erasing data. The memory cell array MCA is provided with a plurality of bit lines and a plurality of word lines. Each memory cell is associated with one bit line and one word line, for example. A detailed configuration of the memory cell array MCA will be described later.

The command resister 1011 retains a command CMD received by the semiconductor storage device 100a from the memory controller 1002. The command CMD includes, for example, an instruction to cause the sequencer 1013 to perform a read operation, a write operation, an erase operation, or the like.

The address resister 1012 retains address information ADD received by the semiconductor storage device 100a from the memory controller 1002. The address information ADD includes, for example, a block address BA, a page address PA, and a column address CA. For example, the block address BA, the page address PA, and the column address CA are used for selecting the blocks BLK, the word lines, and the bit lines, respectively.

The sequencer 1013 controls the operation of the whole semiconductor storage device 100a. For example, the sequencer 1013 controls the driver module 1014, the row decoder module 1015, the sense amplifier module 1016, and the like based on the command CMD retained in the command resister 1011 to perform a read operation, a write operation, an erase operation, or the like.

The driver module 1014 generates a voltage used in a read operation, a write operation, an erase operation, or the like. The driver module 1014 then applies the generated voltage to a signal line corresponding to a selected word line, for example, based on the page address PA retained in the address register 1012.

The row decoder module 1015 includes a plurality of row decoders. The row decoder selects, based on the block address BA retained in the address resister 1012, one block BLK in the corresponding memory cell array MCA. The row decoder then transfers, for example, the voltage applied to the signal line corresponding to the selected word line to the selected word line in the selected block BLK.

The sense amplifier module 1016 applies a desired voltage to each bit line in accordance with write data DAT received from the memory controller 1002 in a write operation. Further, in a read operation, the sense amplifier module 1016 determines data stored in a memory cell based on a voltage of a bit line, reads out the determination result, and transfers the determination result as data DAT to the memory controller 1002.

The semiconductor storage device 100a and the memory controller 102 explained above may be combined to constitute a single semiconductor device. Examples of such a semiconductor device include a memory card such as an SD™ card, an SSD (solid state drive), and the like.

Figure 22:
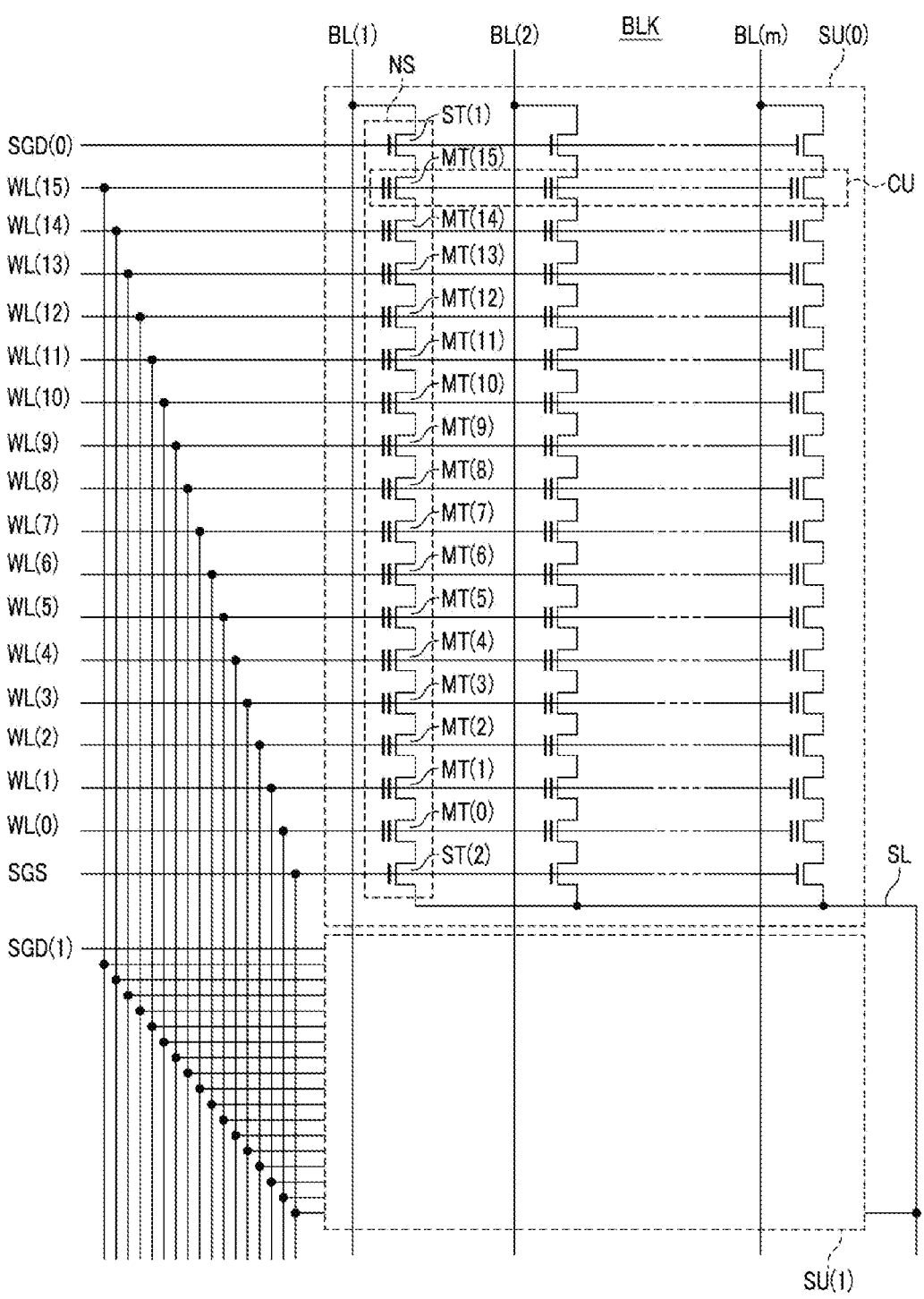
FIG. 22 is a circuit diagram illustrating an example of a circuit configuration of the memory cell array.

FIG. 22 is a circuit diagram illustrating an example of a circuit configuration of the memory cell array MCA. One block BLK is extracted from the blocks BLK included in the memory cell array MCA. As illustrated in FIG. 22, the block BLK includes a plurality of string units SU(0) to SU(k) (k is an integer of 1 or more).

Each string unit SU includes a plurality of NAND strings NS respectively associated with bit lines BL(0) to BL(m) (m is an integer of 1 or more). Each NAND string NS includes, for example, memory cell transistors MT(0) to MT(15) and selection transistors ST(1) and ST(2). The memory transistor MT includes a control gate and a charge storage layer and retains data in a non-volatile manner. Each of the selection transistors ST(1) and ST(2) is used for selecting the string unit SU in various operations.

In each NAND string NS, the memory cell transistors MT(0) to MT(15) are connected in series. A drain of the selection transistor ST(1) is connected to an associated bit line BL, and a source of the selection transistor ST(1) is connected to one end of a series of the memory cell transistors MT(0) to MT(15) connected in series. A drain of the selection transistor ST(2) is connected to the other end of the series of the memory cell transistors MT(0) to MT(15) connected in series. A source of the selection transistor ST(2) is connected to a source line SL.

In the same block BLK, the control gates of the memory cell transistors MT(0) to MT(15) are connected in common to word lines WL(0) to WL(15), respectively. Gates of the selection transistors ST(1) in the string units SU(0) to SU(k) are connected in common to selection gate lines SGD(0) to SGD(k), respectively. Gates of the selection transistors ST(2) are connected in common to a selection gate line SGS.

In the circuit configuration of the memory cell array MCA described above, each bit line BL is shared by the NAND strings NS in the respective string units SU, to which the same column address is assigned. The source line SL is shared by, for example, the blocks BLK.

A set of the memory cell transistors MT connected to the common word line WL in one string unit SU is referred to as "cell unit CU", for example. For example, the storage capacity of the cell unit CU including the memory cell transistors MT each storing therein 1-bit data is defined as "1-page data". The cell unit CU can have a storage capacity of 2-page data or more in accordance with the number of bits of data stored in the memory cell transistors MT.

The memory cell array MCA included in the semiconductor storage device 100a according to the present embodiment is not limited to the circuit configuration described above. For example, each of the numbers of the memory cell transistors MT and the selection transistors ST(1) and ST(2) included in each NAND string NS can be designed to be any number. The number of the string units SU included in each block BLK can be designed to be any number.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:

a stack including a plurality of first electrode films stacked in a first direction and isolated from each other;

a plurality of column portions extending in the stack in the first direction and each including a semiconductor portion;

a first isolating portion extending in the stack in the first direction and a second direction crossing the first direction and configured to isolate the first electrode films in a third direction crossing the first direction and the second direction;

a second isolating portion adjacent to the first isolating portion in the third direction, extending in the stack in the first direction and the second direction, and configured to isolate the first electrode films in the third direction; and third and fourth isolating portions extending in the stack in the first direction and the second direction, configured to isolate only one or more of the first electrode films in an upper portion of the first electrode films in the third direction, and arranged in the third direction between the first isolating portion and the second isolating portion from the first isolating portion toward the second isolating portion, wherein:

the column portions include a first column portion and a second column portion provided between the first isolating portion and the third isolating portion adjacent to the first isolating portion in the third direction, the column portions include a third column portion and a fourth column portion provided between the third isolating portion and the fourth isolating portion adjacent to the third isolating portion, the second column portion is adjacent to the first column portion as viewed in the first direction, the fourth column portion is adjacent to the third column portion as viewed in the first direction, a first interval between the first column portion and the second column portion is different from a second interval between the third column portion and the fourth column portion, an interval between the column portions adjacent to each other between the first isolating portion and the third isolating portion is the first interval and is substantially uniform, and an interval between the column portions adjacent to each other between the third isolating portion and the fourth isolating portion is the second interval and is substantially uniform.

2. The device of claim 1, wherein the second interval is wider than the first interval.

3. The device of claim 1, wherein;

an interval between the column portions adjacent to each other in an end portion of a region between the first isolating portion and the second isolating portion is the first interval, and an interval between the column portions adjacent to each other in a center portion of the region between the first isolating portion and the second isolating portion is the second interval.

4. The device of claim 1, wherein intervals between the column portions differ according to a distance from the first or second isolating portion.

5. The device of claim 1, wherein, in plan view as viewed in the first direction, an interval between the column portions in a direction substantially perpendicular to an extending direction of the first and second isolating portions differs according to a distance from the first or second isolating portion.

6. The device of claim 1, wherein the second interval is narrower than the first interval.

7. The device of claim 6, wherein:

an interval between the column portions adjacent to each other in an end portion of a region between the first isolating portion and the second isolating portion is the first interval, and an interval between the column portions adjacent to each other in a center portion of the region between the first isolating portion and the second isolating portion is the second interval.

8. The device of claim 6, wherein intervals between the column portions differ according to a distance from the first or second isolating portion.

9. The device of claim 1, wherein a diameter of the column portions differs according to a distance from the first and second isolating portions in plan view as viewed in the first direction.

10. The device of claim 9, wherein:

a diameter of the column portions in an end portion of a region between the first isolating portion and the second isolating portion is a first diameter, and a diameter of the column portions in a center portion of the region between the first isolating portion and the second isolating portion is a second diameter smaller than the first diameter.

11. The device of claim 1, further comprising a plurality of memory cells respectively corresponding to intersections of the semiconductor portion and the electrode films.

* * * * *